(12) United States Patent
Tanaka

(10) Patent No.: US 11,239,449 B2
(45) Date of Patent: Feb. 1, 2022

(54) ORGANIC ELECTROLUMINESCENCE ELEMENT INCLUDING CARRIER INJECTION AMOUNT CONTROL ELECTRODE

(71) Applicant: Mikuni Electron Corporation, Saitama (JP)

(72) Inventor: Sakae Tanaka, Saitama (JP)

(73) Assignee: MIKUNI ELECTRON CORPORATION, Saitama (JP)

( * ) Notice: Subject to any disclaimer, the term of this patent is extended or adjusted under 35 U.S.C. 154(b) by 0 days.

(21) Appl. No.: 16/206,744

(22) Filed: Nov. 30, 2018

(65) Prior Publication Data

US 2020/0075897 A1 Mar. 5, 2020

(30) Foreign Application Priority Data

Aug. 31, 2018 (JP) .............................. JP2018-162568

(51) Int. Cl.
*H01L 51/52* (2006.01)
*H01L 51/50* (2006.01)
(Continued)

(52) U.S. Cl.
CPC ........ *H01L 51/5296* (2013.01); *H01L 51/508* (2013.01); *H01L 51/5012* (2013.01);
(Continued)

(58) Field of Classification Search
CPC ............. H01L 27/3246; H01L 51/5203; H01L 51/5209; H01L 51/5225; H01L 51/5072; H01L 51/508; H01L 51/5092
See application file for complete search history.

(56) References Cited

U.S. PATENT DOCUMENTS 5,245,450 A 9/1993 Ukai et al.
6,730,970 B1 5/2004 Katoh et al.
(Continued)

FOREIGN PATENT DOCUMENTS

CN 105762196 A 7/2016
EP 2634812 B1 12/2016
(Continued)

OTHER PUBLICATIONS

Extended European Search Report for Application No. 18173345.2, dated Jan. 14, 2019.
(Continued)

*Primary Examiner* — Aaron J Gray
(74) *Attorney, Agent, or Firm* — Pearne & Gordon LLP

(57) ABSTRACT

An organic electroluminescence element in an embodiment according to the present invention includes a first electrode, a third electrode including a region overlapping the first electrode, a first insulating layer between the first electrode and the third electrode, a second insulating layer between the first insulating layer and the third electrode, an electron transfer layer between the first insulating layer and the third electrode, a light emitting layer, containing an organic electroluminescence material, between the electron transfer layer and the third electrode, and a second electrode located between the first insulating layer and the second insulating layer and electrically connected with the electron transfer layer. The organic electroluminescence element includes an overlap region where the third electrode, the light emitting layer, the electron transfer layer, the first insulating layer and the first electrode overlap each other in an opening of the second insulating layer.

20 Claims, 22 Drawing Sheets

(51) Int. Cl.
*H01L 27/32* (2006.01)
*H01L 51/56* (2006.01)

(52) U.S. Cl.
CPC ...... *H01L 51/5092* (2013.01); *H01L 51/5203* (2013.01); *H01L 51/56* (2013.01); *H01L 27/3244* (2013.01); *H01L 2251/305* (2013.01); *H01L 2251/306* (2013.01); *H01L 2251/5307* (2013.01); *H01L 2251/5315* (2013.01); *H01L 2251/5353* (2013.01)

(56) References Cited

U.S. PATENT DOCUMENTS

| | | | |
|---|---|---|---|
| 8,421,068 B2 | 4/2013 | Yamazaki et al. | |
| 8,598,610 B2 | 12/2013 | Oda | |
| 8,816,380 B2 | 8/2014 | Oda | |
| 10,074,709 B1 | 9/2018 | Tanaka | |
| 2002/0149722 A1 | 10/2002 | Anno et al. | |
| 2002/0167280 A1 | 11/2002 | Hayashi et al. | |
| 2003/0137242 A1* | 7/2003 | Seki | H01L 27/3246 313/506 |
| 2003/0184699 A1 | 10/2003 | Matsumoto et al. | |
| 2003/0197666 A1 | 10/2003 | Akimoto et al. | |
| 2004/0227891 A1 | 11/2004 | Hirota | |
| 2005/0018114 A1 | 1/2005 | Park et al. | |
| 2005/0199880 A1 | 9/2005 | Hoffman et al. | |
| 2007/0069202 A1 | 3/2007 | Choi et al. | |
| 2007/0126671 A1 | 6/2007 | Naoaki | |
| 2007/0269936 A1 | 11/2007 | Tanaka et al. | |
| 2009/0135105 A1 | 5/2009 | Nakamura et al. | |
| 2009/0140955 A1 | 6/2009 | Nakamura et al. | |
| 2009/0179195 A1* | 7/2009 | Obata | H01L 51/0541 257/40 |
| 2009/0179208 A1 | 7/2009 | Obata et al. | |
| 2009/0189161 A1* | 7/2009 | Honda | G09G 3/3233 257/72 |
| 2009/0315043 A1* | 12/2009 | Nakamura | H01L 51/5296 257/88 |
| 2010/0102313 A1 | 4/2010 | Miyairi et al. | |
| 2010/0193782 A1 | 8/2010 | Sakata | |
| 2010/0244020 A1 | 9/2010 | Sakata et al. | |
| 2010/0244710 A1 | 9/2010 | Obata et al. | |
| 2010/0279474 A1 | 11/2010 | Akimoto et al. | |
| 2011/0090417 A1 | 4/2011 | Kim et al. | |
| 2011/0108835 A1 | 5/2011 | Kim et al. | |
| 2011/0127521 A1 | 6/2011 | Yamazaki | |
| 2011/0133178 A1 | 6/2011 | Yamazaki et al. | |
| 2011/0147738 A1 | 6/2011 | Yamazaki et al. | |
| 2011/0248258 A1 | 10/2011 | Kim et al. | |
| 2012/0138922 A1 | 6/2012 | Yamazaki et al. | |
| 2012/0146062 A1 | 6/2012 | Oda | |
| 2012/0146713 A1 | 6/2012 | Kim et al. | |
| 2012/0248451 A1 | 10/2012 | Sone et al. | |
| 2012/0313903 A1 | 12/2012 | Pyon et al. | |
| 2013/0001602 A1 | 1/2013 | Park et al. | |
| 2013/0270552 A1 | 10/2013 | Yamazaki et al. | |
| 2014/0111406 A1 | 4/2014 | Wang et al. | |
| 2014/0340608 A1 | 11/2014 | Yamazaki et al. | |
| 2015/0137103 A1 | 5/2015 | Hosono et al. | |
| 2015/0153599 A1 | 6/2015 | Yamazaki et al. | |
| 2015/0221678 A1 | 8/2015 | Yamazaki et al. | |
| 2015/0228799 A1 | 8/2015 | Koezuka et al. | |
| 2016/0056214 A1 | 2/2016 | Pyo et al. | |
| 2016/0155980 A1* | 6/2016 | Lee | H01L 51/5296 257/40 |
| 2016/0285027 A1 | 9/2016 | Hosono et al. | |
| 2016/0343868 A1 | 11/2016 | Koezuka et al. | |
| 2017/0117705 A1 | 4/2017 | Sekine et al. | |
| 2017/0176826 A1 | 6/2017 | Tsuda et al. | |
| 2018/0122833 A1 | 5/2018 | Lee et al. | |
| 2018/0166585 A1 | 6/2018 | Takechi | |
| 2018/0301472 A1 | 10/2018 | Matsukizono | |
| 2019/0013333 A1 | 1/2019 | Inoue et al. | |
| 2020/0373430 A1 | 11/2020 | Shima et al. | |

FOREIGN PATENT DOCUMENTS

| | | |
|---|---|---|
| EP | 18173345.2 | 10/2018 |
| EP | 3410490 A3 | 2/2019 |
| EP | 3 618 136 A2 | 3/2020 |
| JP | H09-269508 A | 10/1997 |
| JP | 2909266 B2 | 6/1999 |
| JP | 2001-144298 A | 5/2001 |
| JP | 2002-311424 A | 10/2002 |
| JP | 2002343578 A | 11/2002 |
| JP | 2003-295207 A | 10/2003 |
| JP | 2004-341465 A | 12/2004 |
| JP | 2005-004193 A | 1/2005 |
| JP | 200753286 A | 3/2007 |
| JP | 2007-095685 A | 4/2007 |
| JP | 2007149922 A | 6/2007 |
| JP | 2007157871 A | 6/2007 |
| JP | 2007310334 A | 11/2007 |
| JP | 2009075613 A | 4/2009 |
| JP | 2010-251731 A | 11/2010 |
| JP | 2010-283338 A | 12/2010 |
| JP | 2011-146694 A | 7/2011 |
| JP | 2011-223004 A | 11/2011 |
| JP | 2014154382 A | 8/2014 |
| JP | 2015-179822 A | 10/2015 |
| JP | 2016-219801 A | 12/2016 |
| JP | 2017-084868 A | 5/2017 |
| JP | 2017-116622 A | 6/2017 |
| JP | 2017-168860 A | 9/2017 |
| JP | 2018-098364 A | 6/2018 |
| JP | 2019-016659 A | 1/2019 |
| JP | 2019-149561 A | 9/2019 |
| KR | 10-2011-0041139 A | 4/2011 |
| KR | 10-2014-0081662 A | 7/2014 |
| WO | 2007043697 A | 4/2007 |
| WO | 2015/098458 A1 | 7/2015 |
| WO | 2016/195039 A1 | 12/2016 |
| WO | 2019/043510 A1 | 3/2019 |

OTHER PUBLICATIONS

Partial European Search Report for Application No. 18173345.2, dated Oct. 2, 2018.
Extended European Search Report for 19 21 3814 dated May 19, 2020.
Hideo Hosono et al,"Transparent amorphous oxide semiconductors for organic electronics: Application to invertes OLEDs", PNAS Early Edition.
Extended European Search Report dated Feb. 14, 2020 for the corresponding EP application No. 19199145.4.
Extended European Search Report dated Feb. 11, 2020 for the corresponding EP application No. 19186679.7.
Notice of Allowance dated Jan. 19, 2021 for the relative Japanese application No. 2017-107278.
Notice of Allowance dated Sep. 30, 2020 for the copending U.S. Appl. No. 16/678,229.
U.S. Office Action issued in U.S. Appl. No. 16/577,044 dated Jun. 24, 2021.
Extended European search report issued in European Patent Application No. 21154269.1 dated Jul. 15, 2021.
U.S. Office Action issued in U.S. Appl. No. 16/860,160 dated Mar. 3, 2021.

* cited by examiner

ORGANIC ELECTROLUMINESCENCE ELEMENT INCLUDING CARRIER INJECTION AMOUNT CONTROL ELECTRODE

CROSS REFERENCE TO RELATED APPLICATIONS

This application is based upon and claims the benefit of priority from the prior Japanese Patent Application No. 2018-162568 filed on Aug. 31, 2018, the entire contents of which are incorporated herein by reference.

FIELD

An embodiment of the present invention relates to an element structure of an organic electroluminescence element (hereinafter, referred to also as an "organic EL element") using an organic electroluminescence material, specifically to an organic electroluminescence element including an electrode that controls the amount of carriers to be injected into a light emitting layer.

BACKGROUND

An organic EL element includes a pair of electrodes referred to as a "positive electrode" and a "negative electrode") and a light emitting layer located between the pair of electrodes. A basic structure of an organic EL element includes two terminals. However, a three-terminal organic EL element including a third electrode in addition to the two terminals has been disclosed.

For example, an organic EL element including a positive electrode, a light emitting material layer formed of an organic electroluminescence material, a negative electrode, and an auxiliary electrode facing the negative electrode and the light emitting material layer with an insulating layer being provided between the auxiliary electrode and the negative electrode/the light emitting material layer is disclosed (see, for example. Japanese Laid-Open Patent Publication No. 2002-343578). A light emitting transistor including a hole injection layer, a carrier dispersion layer, a hole transfer layer and a light emitting layer that are stacked in this order, between a positive electrode and a negative electrode, from the side of the positive electrode, and further including an auxiliary electrode facing the positive electrode with an insulating film being provided between the auxiliary electrode and the positive electrode has been disclosed (see, for example, WO2007/043697).

An organic light emitting transistor element including an auxiliary electrode, an insulating film provided on the auxiliary electrode, a first electrode provided with a predetermined size on the insulating film, a charge injection suppression layer provided on the first electrode, a charge injection layer provided on a region of the insulating film where the first electrode is not provided, a light emitting layer provided on the charge injection suppression layer and the charge injection layer or provided on the charge injection layer, and a second electrode provided on the light emitting layer has been disclosed (see, for example, Japanese Laid-Open Patent Publication No. 2007-149922 and Japanese Laid-Open Patent Publication No. 2007-157871).

SUMMARY

An organic electroluminescence element in an embodiment according to the present invention includes a first electrode, a third electrode including a region overlapping the first electrode, a first insulating layer between the first electrode and the third electrode, a second insulating layer between the first insulating layer and the third electrode, an electron transfer layer between the first insulating layer and the third electrode, a light emitting layer, containing an organic electroluminescence material, between die electron transfer layer and the third electrode, and a second electrode located between the first insulating layer and the second insulating layer and electrically connected with the electron transfer layer. The second insulating layer includes an opening, the organic electroluminescence element includes an overlap region where the third electrode, the light emitting layer, the electron transfer layer, the first insulating layer and the first electrode overlap each other in the opening, and the second electrode is located outer to the overlap region.

In an embodiment of the present invention, it is preferred that the electron transfer layer included in the organic electroluminescence element is formed of a light-transmissive metal oxide material, for example, an n-type oxide semiconductor material.

DESCRIPTION OF EMBODIMENTS

Figure 1:
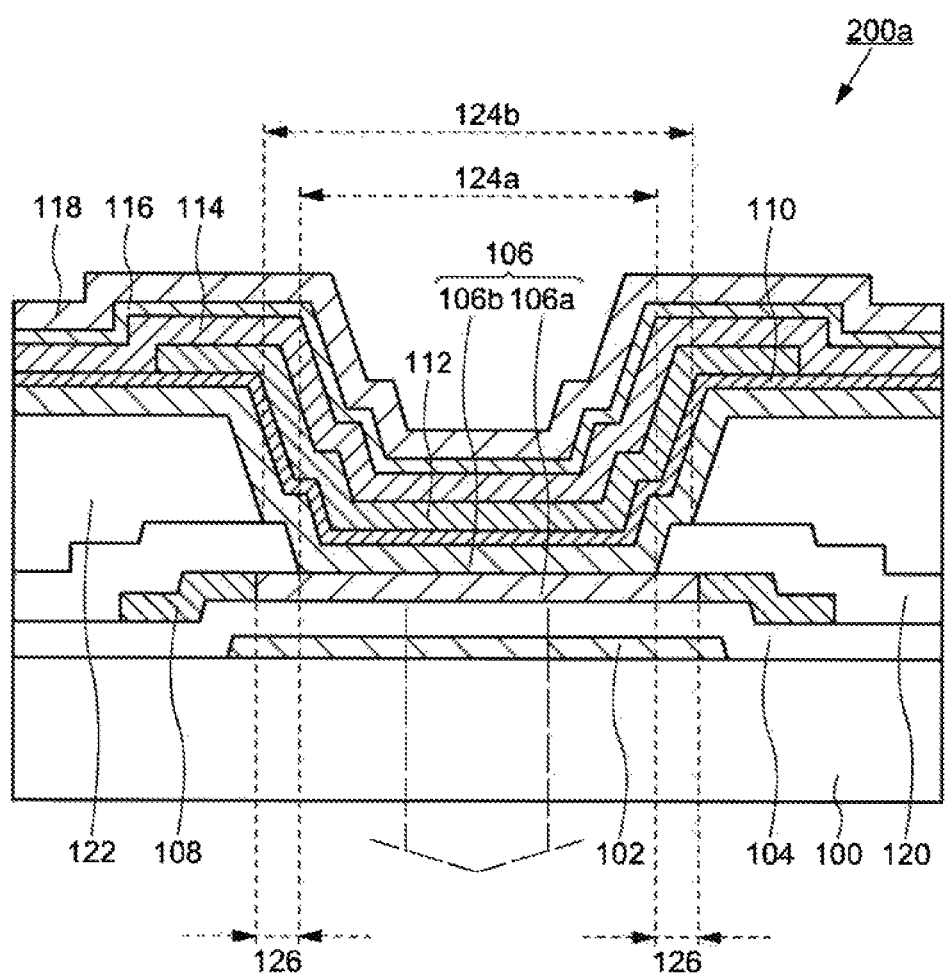
FIG. 1 is a cross-sectional view showing a structure of an organic EL element in an embodiment according to the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way. In the specification and the drawings, components that are substantially the same as those described or shown previously bear the identical reference signs thereto (or the identical reference signs followed by letters "a", "b" or the like), and detailed descriptions thereof may be omitted. The terms "first", "second" and the like used for elements are merely provided for distinguishing the elements and do not have any other significance unless otherwise specified.

In the specification and the claims, an expression that a component is "an" another component encompasses a case where such a component is in contact with another component and also a case where such a component is above or below the another component, namely, a case where still another component is provided between such a component and the another component, unless otherwise specified.

First Embodiment

1. Structure of the Organic EL Element

The structure of an organic EL element is classified based on the direction in which emitting light is output, into a bottom-emission type and a top-emission type. In the bottom-emission type, emitting light is output through a substrate. In the top-emission type, emitting light is output in a direction away from the substrate. The structure of an organic EL element is also classified, based on the order of stacking in the production process, into a forward-stacking structure and a reverse-stacking structure. In the forward-stacking structure, a positive electrode, a hole transfer layer, a light emitting layer, an electron transfer layer and a negative electrode are stacked in this order from the side of the substrate. In the reverse-stacking structure, the layers and the electrodes are stacked in the order opposite to the above from the side of the substrate. An organic EL element in this embodiment is of the reverse-stacking structure and is applicable to both of the bottom-emission type and the top-emission type.

The organic EL element disclosed in Japanese Laid-Open Patent Publication No. 2002-243578 has the following problems. Since the light emitting material layer has a low electron mobility, the amount of electrons to be injected from the negative electrode is mostly determined based on the potential difference between the positive electrode and the negative electrode, and thus the bias voltage applied from the auxiliary electrode has almost no influence on the carrier injection. In addition, since the light emitting material layer has a high resistance in addition to the low electron mobility, the electrons injected into the light emitting material layer are concentrated in the vicinity of the negative electrode, and thus the bias voltage applied to the auxiliary electrode has almost no influence on the amount of the electrons to be injected.

The light emitting transistor described in WO2007/023697 has the following problems. The auxiliary electrode controls the light emission/light non-emission state, and therefore, the amounts of carriers of different polarities, namely, electrons and holes, to be injected into the light emitting layer cannot be independently controlled even by use of an external circuit. The light emitting transistor described in Japanese Laid-Open Patent Publication No 2002-343578 has a problem that a region in the light emitting layer in which the electrons and the holes are recombined, namely, the position of the light emitting layer, is not controlled. The organic light emitting transistor elements described in Japanese Laid-Open Patent Publication No. 2007-149922 and Japanese Laid-Open Patent Publication No. 2007-157871 both have a problem that the electron transfer layer formed of an organic material has a low carrier (electron) mobility, and therefore, a larger screen or a higher definition is not realized for the display panel.

As described below in detail, the organic EL element in this embodiment according to the present invention has a structure solving these problems.

1-1. Bottom Emission-Type Organic EL Element

FIG. 1 shows a cross-sectional structure of an organic EL element 200a in an embodiment according to the present invention. The organic EL element 200a shown in FIG. 1 is of the bottom-emission type and is of the reverse-stacking structure. More specifically, the organic EL element 200a includes a substrate 100, and also includes a first electrode 102, a first insulating layer 104, an electron transfer layer 106 (a first electron transfer layer 106a and a second electron transfer layer 106b), a light emitting layer 112, and a third electrode 118, which are stacked on the substrate 100 in this order from the side of the substrate 100.

The organic EL element 200a shown in FIG. 1 further includes a hole transfer layer 114 and a hole injection layer 116 between the light emitting layer 112 and the third electrode 118. The organic EL element 200a does not need to include one of a hole injection layer 116 and the hole transfer layer 114, or may include a hole injection and transfer layer having functions of both of hole injection and hole transfer, instead of the hole injection layer 116 and the hole transfer layer 114. Although not shown in FIG. 1, the organic EL element 200a may include a hole block layer between the electron injection layer 110 and the light emitting layer 112, or may include an electron block layer between the light emitting layer 112 and the hole transfer layer 114.

In the organic EL element 200a shown in FIG. 1, the first electrode 102, the first insulating layer 104, the electron transfer layer 106 (the first electron transfer layer 106a and the second electron transfer layer 106b), the electron injection layer 110, the light emitting layer 112 and the third electrode 118 overlap each other each other in a vertical direction. The second electrode 108 is located outer to a region where these layers overlap each other (overlap region), and is located to be electrically connected with the first electron transfer layer 106a. The second electrode 108 is provided to contact at least a part of the first electron transfer layer 106a. For example, the second electrode 108 may be provided to enclose the first electron transfer layer 106a. In this specification, the expression "these layers" may include an electrode or electrodes. For example, in this paragraph, "these layers" include the first electrode 102, first insulating layer 104, and the third electrode 118.

In FIG. 1, the third electrode 118 has a function of injecting holes into the hole injection layer 116, and is referred to also as a "positive electrode" or "anode". The second electrode 108 has a function of injecting electrons into the electron transfer layer 106, and is referred to also as a "negative electrode" or "cathode". The first electrode 102 has a function of controlling the amount of carriers (electrons) to be injected into the light emitting layer 112, and is referred to also as a "carrier injection amount control electrode".

In the organic EL element 200a, the electron transfer layer 106 includes two distinguishable layers namely, the first electron transfer layer 106a and the second electron transfer layer 106b. The electron transfer layer 106 will be described below in detail. The first electron transfer layer 106a and the second electron transfer layer 106b are common to each other in having a function of transferring the electrons injected from the second electrode 108 into the light emitting layer 112. The first electron transfer layer 106a, which is in contact with the second electrode 108, and the second electron transfer layer 106b, which is located closer to the light emitting layer 112, are different from each other in the electron concentration and the electron mobility. For example, it is preferred that the second electron transfer layer 106b has a carrier concentration (electron concentration) lower than a carrier concentration (electron concentration) of the first electron transfer layer 106a in order to avoid deactivation of the carriers.

The organic EL element 200a does not need to include the second electron transfer layer 106b. The first electron transfer layer 106a and the second electron transfer layer 106b may be regarded as one layer because of the common function of transferring the electrons injected from the second electrode 108 into the light emitting layer 112.

The organic EL element 200a may include a second insulating layer 120 located between the first electron transfer layer 106a and the second electron transfer layer 106b. The second insulating layer 120 covers a peripheral region of the first electron transfer layer 106a, and includes an opening 124a exposing a top surface of the first electron transfer layer 106a. The first electron transfer layer 106a and the second electron transfer layer 106b are in contact with each other in the opening 124a of the second insulating layer 120. In a region where the opening 124a is located, the first electron transfer layer 106a, the second electron transfer layer 106b, the electron injection layer 110, the light emitting layer 112 and the third electrode 118 are stacked. A region where these layers are stacked is a light emitting region of the organic EL element 200a. In other words, the light emitting region of the organic EL element 200a is defined by the opening 124a of the second insulating layer 120.

The second electrode 108 is held between the first insulating layer 104 and the second insulating layer 120. With the structure in which the second electrode 108 is held between the first insulating layer 104 and the second insulating layer 120, the second electrode 108 is not exposed to the opening 124a. The second electrode 108 is provided to overlap the third electrode 118 with insulating layers being provided between the second electrode 108 and the third electrode 118. An end of the second electrode 108 is not exposed to the opening 124a of the second insulating layer 120. Therefore, no electric field is concentrated between the third electrode 118 and the second electrode 108 in the light emitting region. Specifically, the organic EL element 200a includes an offset region 126 to prevent the second electrode 108 from being exposed to the opening 124a of the second insulating layer 120. The offset region 126 is from an end of the opening 124a to the end of the second electrode 108, and corresponds to a region of the first electron transfer layer 106a that is held between the first insulating layer 104 and the second insulating layer 120. Assuming that a total thickness of the electron transfer layer 106, the electron injection layer 110, the light emitting layer 112, the hole transfer layer 114, the hole injection layer 116 and the like is 100 nm to 1000 nm, it is preferred that in order to prevent the electric field from being concentrated, the offset region 126 has a length longer than 10 times the total thickness, namely, about 1 μm to about 20 μm, for example, 2 μm to 5 μm.

As described above, in the organic EL element 200a in this embodiment, the second electrode 108 is held between the first insulating layer 104 and the second insulating layer 120, and the end of the second electrode 108 is located outer to the opening 124a of the second insulating layer 120. With such a structure, the organic EL element 200a has an increased withstand voltage and a more uniform light emission intensity in the light emitting region.

FIG. 1 shows a form in which a third insulating layer 122 is provided on the second insulating layer 120. The provision of the third insulating layer 122 on the second insulating layer 120 expands the gap between the third electrode 118 and the second electrode 108 and thus decreases the parasitic capacitance.

The third insulating layer 122 includes an opening 124b, which has a width equal to, or longer than, the width of the opening 124a of the second insulating layer 120. With the structure in which the opening 124b of the third insulating layer 122 is wider greater than the opening 124a of the second insulating layer 120, a stepped portion is formed. It is preferred that a side surface of the second insulating layer 120 exposed to the opening 124a, and a side surface of the third insulating layer 122 exposed to the opening 124b, are inclined such that the openings 124a and 124b expand upward. Such a cross-sectional shape of the openings 124a and 124b alleviates the steepness of the stepped portion. With such a structure, in the case where the second electron transfer layer 106b, the light emitting layer 112, the third electrode 118 and the like are provided to overlap each other in the opening 124a and the opening 124b, these layers are allowed to be formed along the stepped portion. In other words, the second electron transfer layer 106b, the light emitting layer 112, the third electrode 118 and the like are prevented from being cracked, namely, ruptured at the stepped portion.

The first electrode 102 is located to overlap the opening 124a of the second insulating layer 120 and to overlap the first electron transfer layer 106a with the first insulating layer 104 being provided between the first electrode 102 and the first electron transfer layer 106a. The first electrode 102 is insulated from the first electron transfer layer 106a by the first insulating layer 104. The first electrode 102 and the first electron transfer layer 106a do not giving and taking the carriers. However, when a voltage is applied to the first electrode 102, the first electron transfer layer 106a is influenced by an electric field generated by the application of the voltage.

The first electron transfer layer 106a is acted on by the electric field formed by the first electrode 102. The amount of the carriers (electrons) to be transferred from the electron transfer layer 106 (the first electron transfer layer 106a and the second electron transfer layer 106b) to the light emitting layer 112 is controllable by the strength of the electric field of the first electrode 102. As the voltage applied to the first electrode 102 is increased, the level of the electric field acting on the electron transfer layer 106 (the first electron transfer layer 106a and the second electron transfer layer 106b) is also increased. The electric field generated by the application of a positive voltage to the first electrode 102 acts to pull the carriers (electrons) from the second electrode 108 to the first transfer layer 106a. Therefore, the amount of the earners (electrons) to be transferred to the light emitting layer 112 is increased. Namely, the amount of the carriers (electrons) to be transferred from the first transfer layer 106a to the light emitting layer 112 is controllable by the level of the voltage to be applied to the first electrode 102. In other words, the voltage to be applied to the first electrode 102 may be controlled to adjust the balance (carrier balance) between the amount of the electrons to be injected from the second electrode 108 and the amount of the holes to be injected from the third electrode 118.

It is preferred that the first electrode 102 is located to overlap the offset region 126 of the first electrode transfer layer 106a. With such a positional arrangement, the first electrode 102 causes the electric field to act on the offset region 126. When a positive voltage is applied to the first electrode 102, the carriers (electrons) are induced to the first electron transfer layer 106a including the offset region 126, and thus prevents the offset region 126 from having a high resistance. The length of the offset region 126 may be about 1 µm to about 5 µm, so that when the first electrode 102 is connected to the ground potential, the electrons are prevented from flowing from the second electrode 108 to the first electron transfer layer 106a.

The organic EL element 200a shown in FIG. 1 is of the bottom-emission type. Therefore, the first electrode 102 is light-transmissive. The first electrode 102 is formed of, for example, a transparent conductive film. By contrast, the third electrode 118 has a light-reflective surface in order to reflect light radiating from the light emitting layer 112. It is preferred that the third electrode 118 is formed of a material having a large work function in order to inject the holes into the hole injection layer 116. The third electrode 118 is formed of, for example, a transparent conductive film of indium tin oxide (ITO) or the like. The light-reflective surface of the third electrode 118 may be formed by, for example, stacking a metal film of aluminum or the like on the transparent conductive film.

As described below, the electron transfer layer 106 (the first electron transfer layer 106a and the second electron transfer layer 106b) is formed of a light-transmissive oxide semiconductor material. The light-transmissive oxide semiconductor material is an inorganic material and is an oxide, and therefore, is thermally stable. With the structure in which the electron transfer layer 106 is formed of an oxide semiconductor material, the organic EL element 200a realizes a stable structure with no deterioration of characteristics even with the reverse-stacking structure.

1-2. Top-Emission Type Organic EL Element

Figure 2:
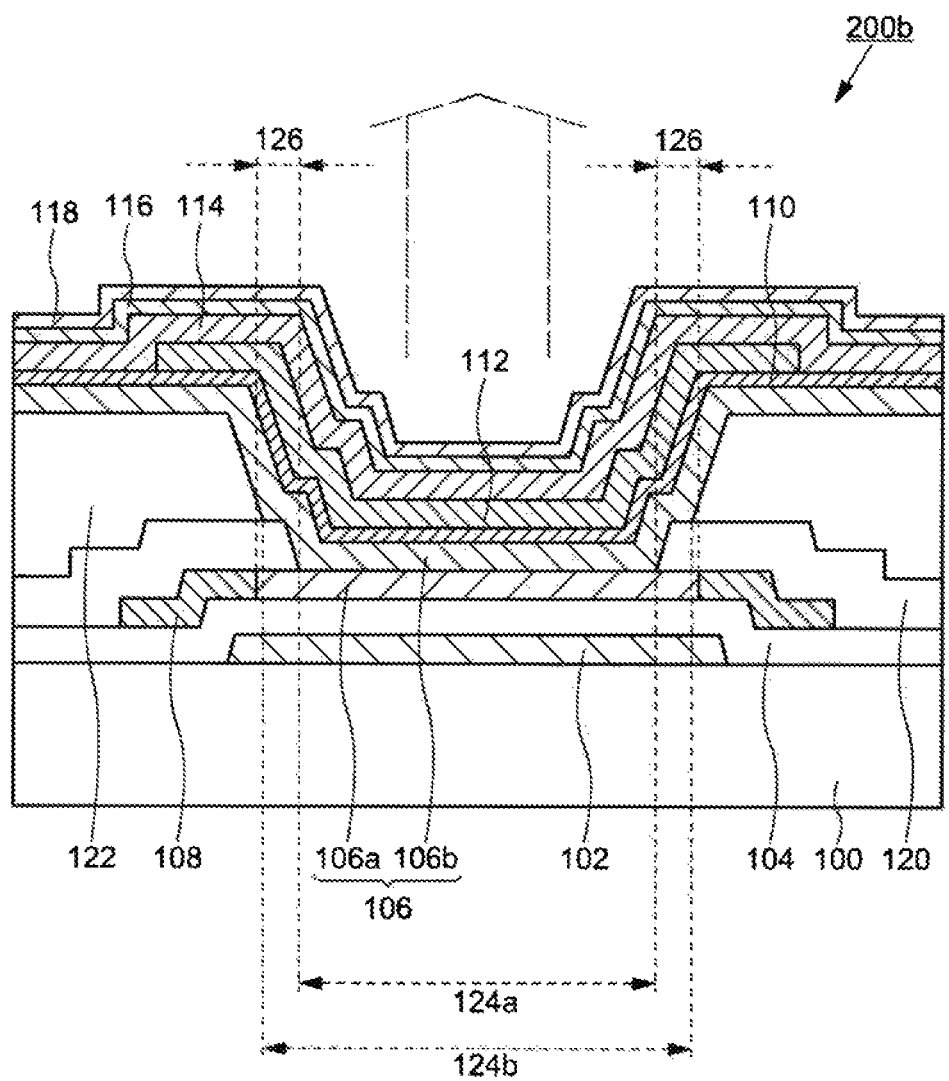
FIG. 2 is a cross-sectional view showing a structure of an organic EL element in an embodiment according to the present invention.

FIG. 2 shows an organic EL element 200b of the top-emission type. The organic EL element 200b of the top-emission type has the same structure as that of the organic EL element 200a of the bottom-emission type except for the structure of the third electrode 118 and the first electrode 102. In the organic EL element 200b of the top-emission type, the first electrode 102 is formed of a metal film to have a metal surface, and the third electrode 118 is formed of a transparent conductive film to transmit light radiating from the light emitting layer 112. The second electrode 108 is located outer to the light emitting region, and thus does not specifically need to be changed in the structure or the material.

The first electrode 102 is formed of a metal film and thus has a function as a light-reflective plate in the organic EL element 200b The electron transfer layer 106 (the first electron transfer layer 106a and the second electron transfer layer 106b) is formed of a light-transmissive oxide semiconductor film. Therefore, the electron transfer layer 106 prevents the light reflected by the first electrode 102 from being attenuated, and thus improves the light extraction efficiency (external quantum efficiency).

The organic EL element 200b of the top-emission type is different from the organic EL element 200a of the bottom-emission type merely in the structure of the third electrode 118 and the first electrode 102. Namely, the organic EL element 200 in this embodiment may be either of the bottom-emission type or the top-emission type with small changes while having the reverse-stacking structure. In this specification, the organic EL element 200a and the organic EL element 200b may be collectively referred to as the "organic EL element 200".

The organic EL element 200a of the bottom-emission type shown in FIG. 1 and the organic EL element 200b of the top-emission type shown in FIG. 2 each have a structure in which the electron transfer layer 106, the electron injection layer 110, the light emitting layer 112 and the third electrode 118 are stacked at least in the vertical direction, the first electrode 102 is provided to be adjacent to the electron transfer layer 106 with the first insulating layer 104 being provided between the first electrode 102 and the electron transfer layer 106, and the second electrode 108 is located outer to the electron transfer layer 106. The potential of the first electrode 102 is controlled independently from the third electrode 118 and the second electrode 108. Therefore, the organic EL element 200 is capable of controlling the amount of the carriers (electrons) to be transferred from the electron transfer layer 106 to the light emitting layer 112. The materials of the first electrode 102 and the third electrode 118 may be appropriately selected, so that the organic EL element 200 is allowed to be of the bottom-emission type or the top-emission type.

2. Components of the Organic EL Element 2-1. First Electrode (Carrier Injection Amount Control Electrode)

The first electrode is formed of a metal material, a conductive metal oxide material, a conductive metal nitride material, or a conductive metal oxide nitride material Examples of the metal material include aluminum (Al), silver (Ag), titanium (Ti), molybdenum (Mo), tantalum (Ta), and the like, and an alloy including such metal materials. Examples of the metal oxide material include indium tin oxide ($In_2O_3 \cdot SnO_2$; ITO), indium zinc oxide ($In_2O_3$—ZnO; IZO), tin oxide ($SnO_2$), and zinc oxide (ZnO). Examples of the metal oxide material further include niobium (Nb)-doped titanium oxide ($TiO_x$:Nb) and the like. Examples of the metal nitride material include titanium nitride ($TiN_x$), zirconium nitride ($ZrN_x$), and the like. Examples of the metal oxide nitride material include titanium oxide nitride ($TiO_xN_y$), tantalum oxide nitride ($TaO_xN_y$), zirconium oxide nitride ($ZrO_xN_y$), hafnium oxide nitride ($HfO_xN_y$), and the like. A trace amount of metal element improving the conductivity may be added to such a metal oxide material, such a metal nitride material and such a metal oxide nitride material. For example, tantalum (Ta)-doped titanium oxide ($TiO_x$:Ta) may be used.

The material of the first electrode 102 is appropriately selected in accordance with whether the organic EL element 200 is of the top-emission type or the bottom-emission type. In the case where the organic EL element 200 is of the bottom-emission type, the first electrode 102 is formed of a metal oxide material, a metal nitride material or a metal oxide nitride material that is conductive and light-transmissive. With such a material, the organic EL element 200a allows the light emitted by the light emitting layer 112 to be transmitted through the first electrode 102 and to be output. By contrast, in the case where the organic EL element 200 is of the top-emission type, the first electrode 102 is formed of a metal material having a high reflectance to visible light. With the structure in which the first electrode 102 is formed of such a metal material, the organic EL element 200b allows the light emitted by the light emitting layer 112 to be reflected by the first electrode 102 and to be output through the third electrode 118.

2-2. First Insulating Layer, Second Insulating Layer, Third Insulating Layer

The first insulating layer 104, the second insulating layer 120 and the third insulating layer 122 are formed of an inorganic insulating material. Examples of the inorganic insulating material include silicon oxide, silicon nitride, silicon oxide nitride, aluminum oxide, and the like. The first insulating layer 104, the second insulating layer 120 and the third insulating layer 122 are formed by plasma CVD (Chemical Vapor Deposition), sputtering, or the like. The first insulating layer 104 is formed to have a thickness of 50 nm to 700 nm, preferably 100 nm to 400 nm. With such a range of the thickness of the first insulating layer 104, the electric field generated by the first electrode 102 acts on the electron transfer layer 106, and thus prevents a tunnel current from flowing from the first electrode 102 to the electron transfer layer 106 by the tunnel effect even in the case where the bias voltage is high. There is no specific limitation on the thickness of the second insulating layer 120 or the third insulating layer 122. The second insulating layer 120 and the third insulating layer 122 are each formed to have a thickness of, for example, 100 nm to 1000 nm.

The first insulating layer 104, the second insulating layer 120 and the third insulating layer 122 are formed of such an insulating material, and therefore, are both insulating and transparent. Thus, the first insulating layer 104, the second insulating layer 120 and the third insulating layer 122 are usable for both of the organic EL element 200a of the bottom-emission type and the organic EL element 200b of the top-emission type. The first insulating layer 104 insulates the first electrode 102 and the electron transfer layer 106 from each other, and also insulate the first electrode 102 and the second electrode 108 from each other.

Alternatively, the third insulating layer 122 may be formed of an organic insulating material such as polyimide resin, acrylic resin, epoxy resin or the like. In the case where the third insulating layer 122 is formed of an organic insulating material, the cross-sectional shape of the opening 124b is easily controllable. It is preferred that an inner surface of the opening 124b of the third insulating layer 122 is inclined, namely, is tapered. In the case where the third insulating layer 122 is formed of a photosensitive organic insulating material, the inner surface of the opening 124b is tapered as seen in a cross-sectional view. In the case where the third insulating layer 122 has a function of a flattening layer, the thickness of the third insulating layer 122 may be increased to about 2 μm to about 5 μm.

2-3. Electron Transfer Layer

It is preferred that the electron transfer layer 106 is formed of a material having a high electron mobility in order to transfer the carriers (electrons) injected from the second electrode 108 into the plane of the light emitting region of the organic EL element 200. In the case where the organic EL element 200 is of the bottom-emission type, the electron transfer layer 106 is located closer to the light output side than the light emitting layer 112. Therefore, it is preferred that the electron transfer layer 106 is formed of a material that is highly light-transmissive to visible light. It is preferred that the electron transfer layer 106 is formed of a material that is easily controllable in the carrier concentration in order to cause the first electron transfer layer 106a and the second electron transfer layer 106b to have different earner concentrations.

In this embodiment, the electron transfer layer 106 (the first electron transfer layer 106a and the second electron transfer layer 106b) is formed of a metal oxide material. A preferred metal oxide material is an oxide semiconductor material having a bandgap of 2.8 eV or wider, preferably 3.0 eV or wider, and a high electron mobility. Such an oxide semiconductor material has semiconductor characteristics even when being formed into a thin film, is light-transmissive to visible light, and exhibits an n-type conductivity.

Examples of the oxide semiconductor material usable for the electron transfer layer 106 include a four-component oxide material, a three-component oxide material, a two-component oxide material and a one-component oxide material. The metal oxide materials listed herein as examples have a bandgap of 2.8 eV or wider, exhibit an n-type conductivity, and control the donor concentration by oxygen deficiency or the like, and therefore, are classified as oxide semiconductor materials.

Examples of the four-component oxide material include an $In_2O_3$—$Ga_2O_3$—$SnO_2$—$ZnO$-based oxide material. Examples of the three-component oxide material include an $In_1O_3$—$Ga_2O_3$—$ZnO$-based oxide material, an $In_2O_3$—$SnO_2$—$ZnO$-based oxide material, an $In_2O_3$—$Al_2O_3$—$ZnO$-based oxide material, a $Ga_2O_3$—$SnO_2$—$ZnO$-based oxide material, a $Ga_2O_3$—$Al_2O_3$—$ZnO$-based oxide material, and an $SnO_2$—$Al_2O_3$—$ZnO$-based oxide material. Examples of the two-component oxide material include an $In_2O_3$—$ZnO$-based oxide material, an $SnO_2$—$ZnO$-based oxide material, an $Al_2O_3$—$ZnO$-based oxide material, a $Ga_2O_3$—$SnO_2$-based oxide material, a $Ga_2O_3$—$ZnO$-based oxide material, a $Ga_2O_3$—$MgO$-based oxide material, an $MgO$—$ZnO$-based oxide material, an $SnO_2$—$MgO$-based oxide material, and an $In_2O_3$—$MgO$-based oxide material. Examples of the one-component oxide material include an $In_2O_3$-based metal oxide material, a $Ga_2O_3$-based metal oxide material, an $SnO_2$-based metal oxide material, a $ZnO$-based metal oxide material, and the like.

Silicon (Si), nickel (Ni), tungsten (W), hafnium (Hf) or titanium (Ti) may be incorporated into any of the above-listed metal oxide materials. It should be noted that, for example, an In—Ga—Zn—O-based oxide material described above merely needs to be a metal oxide material containing at least In, Ga and Zn. There is no limitation on the composition ratio. In other words, the first electron transfer layer 106a and the second electron transfer layer 106b may each be formed of a thin film represented by chemical formula $InMO_3(ZnO)_3$ (m>0) M is one or a plurality of metal elements selected from Ga, Al, Mg, Ti, Ta, W, Hf, and Si. The four-component oxide material, the three-component oxide material, the two-component oxide material and the one-component oxide material described above are not limited to being oxide materials containing an oxide having a stoichiometric composition, and may be oxide materials having a composition diverged from the stoichiometric composition. The oxide semiconductor layer provided as the electron transfer layer 106 may be in an amorphous phase, a crystalline phase or a mixture of the amorphous phase and the crystalline phase.

It is preferred that the first electron transfer layer 106a and the second electron transfer layer 106b are formed of oxide semiconductor materials having different compositions. For example, it is preferred that the first electron transfer layer 106a is formed of a tin (Sn)-based oxide semiconductor material that does not contain zinc (Zn), magnesium (Mg) or the like, namely, is formed of $InGaSnO_x$, $InWSnO_x$, or $InSiSnO_x$. It is preferred that the second electron transfer layer 106b is formed of a zinc (Zn)-based oxide semiconductor material that does not contain tin (Sn), namely, is formed of $ZnSiO_x$, $ZnMgO_x$, $ZnGaO_x$, or the like. In other words, it is preferred that the first electron transfer layer 106a is formed of a metal oxide containing tin oxide, indium oxide, and at least one selected from gallium oxide, tungsten oxide, aluminum oxide and silicon oxide. It is preferred that the second electron transfer layer 106b is formed of a metal oxide containing zinc oxide, and at least one selected from silicon oxide, magnesium oxide, aluminum oxide and gallium oxide.

The oxide semiconductor materials having different compositions may be selected as described above, so that the bandgaps of the first electron transfer layer 106a and the second electron transfer layer 106b are optimized. For example, the bandgap of the second electron transfer layer 106b may be made wider than the bandgap of the first electron transfer layer 106a. Specifically, the bandgap of the first electron transfer layer 106a may be made 3.0 eV or wider and the bandgap of the second electron transfer layer 106b may be made wider than the bandgap of the first electron transfer layer 106a. It is preferred that the bandgap of the second electron transfer layer 106b is 3.4 eV or wider. In the case where the bandgap of the second electron transfer layer 106b is 3.4 eV or wider, the amount of blue light that is absorbed is decreased, which improves the reliability.

The electron transfer layer 106 (the first electron transfer layer 106a and the second electron transfer layer 106b) is formed of indium tin oxide ($In_2O_3.SnO_1$; ITO), indium zinc oxide ($In_2O_3.ZnO$; IZO), tin oxide ($SnO_2$), titanium oxide ($TiO_x$), or the like. A metal nitride material or a metal oxide nitride material also be used for the electron transport layer 106. Examples of the metal nitride material include gallium nitride (GaN), aluminum nitride-gallium ($GaAlN_x$), and the like. Examples of the metal oxide nitride material include titanium oxide nitride ($TiO_xN_y$), tantalum oxide nitride ($TaO_xN_y$), zirconium oxide nitride ($ZrO_xN_y$), hafnium oxide nitride ($HfO_xN_y$), and the like. A trace amount of metal element improving the conductivity may be added to such a metal oxide material, such a metal nitride material and such a metal oxide nitride material. For example, niobium (Nb)-doped titanium oxide ($TiO_x$:Nb) may be used. In order to make the bandgaps of these metal compounds at least 2.8 eV or wider, the content of oxygen or the content of nitrogen may be adjusted.

The first electron transfer layer 106a and the second electron transfer layer 106b formed of an oxide semiconductor material may be formed by sputtering, vacuum vapor deposition, coating or the like. It is preferred that the first electron transfer layer 106a has a thickness of 10 nm to 200 nm, and that the second electron transfer layer 106b has a thickness of 50 nm to 500 nm.

It is preferred that the carrier concentration of the first electron transfer layer 106a is at least 10 times, preferably at least 100 times, the carrier concentration of the second electron transfer layer 106b. For example, it is preferred that the carrier concentration (electron concentration) of the first electron transfer layer 106a is in the range of $10^{14}/cm^3$ to $10^{19}/cm^3$, that the carrier concentration (electron concentration) of the second electron transfer layer 106b is in the range of $10^{11}/cm^3$ to $10^{17}/cm^3$, and that the carrier concentration difference between the first electron transfer layer 106a and the second electron transfer layer 106b is at least one digit, preferably at least two digits, as described above.

It is preferred that the electron mobility of the second electron transfer layer 106b is at most ⅕ to ¹⁄₁₀ of the electron mobility of the first electron transfer layer 106a. For example, it is preferred that the electron mobility of the first electron transfer layer 106a is 1 $cm^2/V·sec$ to 50 $cm^2/V·sec$, and that the electron mobility of the second electron transfer layer 106b is 0.01 $cm^2/V·sec$ to 10 $cm^2/V·sec$.

The first electron transfer layer 106a may have the above-described carrier concentration and electron mobility to be decreased in the resistance. The first electron transfer layer 106a may have such properties to uniformize the planar distribution of the electrons injected from the second electrode 108. In other words, the carriers (electrons) injected by the second electrode 108 from a region around the first electron transfer layer 106a is transferred toward a central region of the first electron transfer layer 106a to uniformize the electron concentration in the light emitting region. This uniformizes the planar light emission intensity of the organic EL element 200. The use of the first electron transfer layer 106a, which has a relatively high conductivity, allows the carriers (electrons) injected from the second electrode 108 to be transferred into the region on which the electric field of the first electrode 102 acts.

The second electron transfer layer 106b is located close to the light emitting layer 112. Therefore, in the case where the carrier (electron) concentration of the second electron transfer layer 106b is $10^{20}/cm^3$ or higher, the excited state of the tight emitting layer 112 is deactivated to decrease the light emission efficiency. By contrast, in the case where the carrier (electron) concentration of the second electron transfer layer 106b is $10^{11}/cm^3$ or lower, the amount of the carriers that are supplied to the light emitting layer 112 is decreased, and thus a sufficiently high luminance is not provided. In the case where the carrier concentration and the electron mobility may be made different between the first electron transfer layer 106a and the second electron transfer layer 106b as described above, the light emission efficiency of the organic EL element 200 is improved, and the light emission intensity is made uniform in the plane 2-4 Second Electrode (Negative Electrode)

Conventionally, as a material of a negative electrode of an organic EL element, an aluminum-lithium alloy (AlLi), a magnesium-silver alloy (MgAg) or the like is used. However, these materials are easily deteriorated by an influence of oxygen in the air or moisture, and are difficult to be handled. These materials are metal materials or alkaline metal materials, and need to be decreased in the thickness to be semipermeable membranes in order to be light-transmissive. However, there is a problem that a negative electrode, when being decreased in the thickness, is increased in the sheet resistance. The resistance of an electrode acts as a series resistance component in the organic EL element. Therefore, such decrease in the thickness of the negative electrode increases the driving voltage, which increases the power consumption. In addition, such decrease in the thickness of the negative electrode causes the light emission intensity (luminance) to be non-uniform in the plane of the light emission region of the organic EL element.

In the organic EL element 200 in this embodiment, the second electrode 108 is formed of a metal oxide material, like the first electron transfer layer 106a. In other words, the second electrode 108 is formed of an oxide semiconductor material. The second electrode 108 is formed by, for example, decreasing the resistance of a peripheral region of the oxide semiconductor layer that is to be the first electron transfer layer 106a. It is preferred that the carrier concentration of the second electrode 108 is $10^{20}/cm^3$ to $10^{21}/cm^3$. In the case of having such a carrier concentration, the second electrode 108 is decreased in the resistance and thus is suppressed in the series resistance loss. This decreases the power consumption of, and improves the current efficiency of, the organic EL element 200.

The second electrode 108 may be formed by decreasing the resistance of a part of the first electron transfer layer 106a. Specifically, the level of the oxygen deficiency in a part of the oxide semiconductor layer (region corresponding to the second electrode 108) may be increased (by decreasing the donor defect) to decrease the resistance of this region. In order to selectively increase the level of the oxygen deficiency in a part of the oxide semiconductor layer, it is effective to heat the part. Specifically, laser light is directed toward a part of the oxide semiconductor layer to cause the region to be increased in the level of the oxygen deficiency. Since the oxide semiconductor layer has a wide bandgap, it is preferred to use a laser light source capable of oscillating laser light having a short wavelength. For example, a KrF excimer laser (wavelength: 248 nm), an XeCl excimer laser (wavelength: 308 nm), an XeF excimer laser (wavelength: 351 nm) or the like is usable as the laser light source. In the case where a solid-state laser such as a YAG laser or the like is used as the light source, third harmonic of the oscillation wavelength may be directed toward the oxide semiconductor layer.

The level of the oxygen deficiency (donor defect) of a part of the first electron transfer layer 106a may be increased to form the second electrode 108, so that a state where the second electrode 108 and the first electron transfer layer 106a are joined together (state where lattice continuity is maintained) is provided. With such a structure, formation of a barrier (energy barrier) inhibiting the injection of the electrons is prevented at an interface between the second electrode 108 and the first electron transfer layer 106a. As a result, the series resistance of the organic EL element 200 is prevented from increasing, and thus the driving voltage is prevented from increasing In addition, the power consumption of the organic EL element 200 is decreased.

Although not shown in FIG. 1, the second electrode 108 may be formed of a metal material such as aluminum (Al), molybdenum (Mo), copper (Cu) or the like, as a layer different from the first electron transfer layer 106a. In this case, the second electrode 108 is located outer to the region where the third electrode 118, the light emitting layer 112, the electron transfer layer 106 and the like overlap each other (namely, is located outer to the light emitting region). Therefore, the second electrode 108 is decreased in the resistance with no need to be decreased in the thickness.

2-5. Electron Injection Layer

In an organic EL element, an electron injection layer is used to decrease the energy barrier, which is used to inject electrons from the negative electrode into an electron transfer layer. It is preferred that the organic EL element 200 in this embodiment includes the electron injection layer 110 in order to allow the electrons to be easily injected into the light emitting layer 112 from the electron transfer layer 106 formed of an oxide semiconductor material. The electron injection layer 110 is provided between the electron transfer layer 106 and the light emitting layer 112.

It is preferred that the electron injection layer 110 is formed of a material having a small work function in order to inject the electrons into the light emitting layer 112 containing an organic electroluminescence material. The electron injection layer 110 is formed of a material containing an oxide of calcium (Ca) and an oxide of aluminum (Al). It is preferred that the electron injection layer 110 is formed of, for example, C12A7 ($12CaO.7Al_2O_3$) electride. C12A7 electride has semiconductor characteristics, is controllable between a high resistance to a low resistance, and has a work function of 2.4 eV to 3.2 eV, which is approximately equal to the work function of an alkaline metal material. Therefore, C12A7 electride is preferably usable for the electron injection layer 110.

The electron injection layer 110, in the case of being formed of C12A7 electride, is formed by sputtering by use of polycrystal of C12A7 electride as a target. C12A7 electride has semiconductor characteristics, and therefore, the electron injection layer 110 may have a thickness in the range of 1 nm to 100 nm. It is preferred that C12A7 electride has a Ca:Al molar ratio in the range of 13:13 to 11:16. In the case of being formed of C12A7 electride, the electron injection layer 110 may be formed by sputtering. It is preferred that the electron injection layer 110, in the case of being formed of C12A7 electride, is amorphous, but may be crystalline.

C12A7 electride is stable in the air, and therefore, has an advantage of being easier to be handled than an alkaline metal material conventionally used to form an electron injection layer, such as lithium fluoride (LiF), lithium oxide ($Li_2O$), sodium chloride (NaCl), potassium chloride (KCl) or the like. Therefore, it becomes unnecessary to work in dry air or inactive gas to produce the organic EL element 200, which alleviates the restriction on production conditions.

C12A7 electride has a large ionization potential. Therefore, the electron injection layer 110 may be located opposite to the hole transfer layer 114 with the light emitting layer 112 being provided between the electron injection layer 110 and the hole transfer layer 114, so as to be used as a hole block layer. More specifically, the electron injection layer 110 formed of C12A7 electride may be provided between the electron transfer layer 106 and the light emitting layer 112, so that the holes injected into the light emitting layer 112 are suppressed from running toward the second electrode 108, which improves the light emission efficiency. Magnesium zinc oxide ($Mg_xZn_yO$; e.g., $Mg_{0.3}Zn_{0.7}O$) has a work function of as small as 3.1 eV and is highly stable in the air. Therefore, magnesium zinc oxide is also usable for the electron injection layer 110, like C12A7 electride.

2-6. Light Emitting Layer

The light emitting layer 112 is formed of an organic electroluminescence material. Examples of the organic electroluminescence material include a fluorescent compound material emitting fluorescence, a phosphorescent compound material emitting phosphorescence, and a thermally activated delayed fluorescence (TADF) material.

Examples of light emitting material emitting blue light usable for the light emitting layer 112 include N,N'-bis[4-(9H-carbazole-9-yl)phenyl-N,N'-diphenylstilbene-4,4'-diamine (YGAS2S), 4-(9H-carbazole-9-yl)-4'-(10-phenyl-9-anthryl)triphenylamine (YGAPA), and the like. Examples of light emitting material emitting green light usable for the light emitting layer 112 include N-(9,10-diphenyl-2-anthryl)-N,9-diphenyl-9H-carbazole-3-amine (2PCAPA), N-[9,10-bis(1,1'-biphenyl-2-yl)-2-anthryl]-N,9-diphenyl-9H-carbazole-3-amine (2PCABPhA), N-(9,10-diphenyl-2-anthryl)-N,N',N'-triphenyl-1,4-phenylenediamine (2DPAPA), N-(9,10-bis(1,1'-biphenyl-2-yl)-2-anthryl]-N,N',N'-triphenyl-1,4-phenylenediamine (2DPABPhA), N-[9,10-bis(1,1'-biphenyl-2-yl)]-N-[4-(9H-carbazole-9-yl)phenyl]-N-phenylanthracene-2-amine (2YGABPhA). N,N,9-triphenylanthracene-9-amine (DPhAPhA), and the like. Examples of light emitting material emitting red light usable for the light emitting layer 112 include N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-diamine (p-mPhAFD), and the like. A phosphorescent material such as bis[2-(2'-benzo[4,5-α]thienyl)pyridinatho-N,$C^3$']iridium(III)acetylacetonate(Ir(btp)$_2$ (acac)) or the like is also usable.

In addition to the above-listed materials, various known materials such as quantum dot (QD) and the like are usable to form the light emitting layer 112. The light emitting layer 112 may be formed by vapor deposition, transfer, spin-coating, spray-coating, printing (inkjet printing, gravure printing) or the like. The light emitting layer 112 may have a thickness appropriately selected. The thickness of the light emitting layer 112 is, for example, in the range of 10 nm to 100 nm.

FIG. 1 and FIG. 2 each show an example in which one light emitting layer 112 is provided for one organic EL element 200. Alternatively, in the case where a plurality of organic EL elements 200 are arrayed on one plane, the light emitting layer 112 may be provided continuously over the plurality of light emitting elements 200.

2-7. Hole Transfer Layer

The hole transfer layer 114 is formed of a material having hole transferability. The hole transfer layer 114 is formed of, for example, an arylamine-based compound, an amine compound containing a carbozole group, an amine compound containing a fluorene derivative, or the like Examples of materials usable for the hole transfer layer 114 include organic materials such as 4,4'-bis[N-(naphtyl)-N-phenylamino]biphenyl (α-NPD), N,N'-bis(3-methylphenyl)-(1,1'-biphenyl)-4,4'-diamine (TPD), 2-TNANA, 4,4',4"-tris(N-(3-methylphenyl)N-phenylamino)triphenylamine (MTDATA), 4,4'-N,N'-dicarbazolebiphenyl (CBP), 4,4'-bis[N-(9,9-dimethylfluorene-2-yl)-N-phenylamino]biphenyl (DFLDPBi), 4,4'bis[N-(spiro-9,9'-bifluorene-2-yl)-N-phenylamino]biphenyl (BSPB), spiro-NPD, spiro-TPD, spiro-TAD, TNB, and the like.

The hole transfer layer 114 is formed by a general film formation method such as vapor deposition, coating or the like. The hole transfer layer 114 is formed to have a thickness of 10 nm to 500 nm.

2-8. Hole Injection Layer

The hole injection layer 116 is formed of a material having a high capability of injecting holes into an organic layer Examples of materials having a high capability of injecting holes and usable for the hole injection layer 116 include metal oxides such as an oxide of molybdenum, an oxide of vanadium, an oxide of ruthenium, an oxide of tungsten, an oxide of manganese and the like. Examples of materials having a high capability of injecting holes and usable for the hole injection layer 116 also include organic compounds such as phthalocyanine ($H_2PC$), copper (II) phthalocyanine (CuPc), vanadylphthalocyanine (VoPc), 4,4',4"-tris(N,N-diphenylamino)triphenylamine (TDATA), 4,4',4"-tris(N-(3-methylphenyl)-N-phenylamino]triphenylamine (MTDATA), 4,4'-bis[N-(4-diphenylaminophenyl)-N-phenylamino)biphenyl (DPAB), 4,4'-bis(N-{4-[N'-(3-methylphenyl)-N'-phenylamino]phenyl}-N-phenylamino) biphenyl (DNPTD), 1,3,5-tris[N-(4-diphenylaminophenyl)-N-phenylamino]benzene (DPA3B), 3-[N-(9-phenylcarbozole-3-yl)-N-phenylamino]-9-phenylcarbazole (PCzPCA1), 3,6-bis (N-(9-phenylcarbazole-3-yl)-N-phenylamino]-9-phenylcarbazole (PCzPCA2), 3-[N-(1-naphtyl)-N-(9-phenylcarbazole-3-yl)amino]-9-phenylcarbazole (PCzPCN1), 2,3,6,7,10,11-hexacyano-1,4,5,8,9,12-hexaazatriphenylene (HAT-CN), and the like.

The hole injection layer 116 is formed by a general film formation method such as vapor deposition, coating or the like. The hole injection layer 116 is formed to have a thickness of 1 nm to 100 nm.

2-9. Third Electrode (Positive Electrode)

The third electrode 118 is formed of a metal material, an alloy or a conductive compound material having a large work function (specifically, 4.0 eV or larger). The third electrode 118 is formed of, for example, indium tin oxide (ITO), indium zinc oxide (IZO), indium oxide containing tungsten oxide and zinc oxide (IWZO) or the like. The third electrode 118 formed of such a conductive metal oxide material is formed by vacuum vapor deposition or sputtering.

As described above with reference to FIG. 1, in the case of the organic EL element 200a of the bottom-emission type, the third electrode 118 is located on the side opposite to the surface from which the light is output. Therefore, it is preferred that the third electrode 118 has a light-reflective surface. In this case, it is preferred that the third electrode 118 includes a transparent conductive film and a metal film stacked on the transparent conductive film. By contrast, as described above with reference to FIG. 2, in the case of the organic EL element 200b of the top-emission type, the third electrode 118 may be formed of a transparent conductive film described above.

3. Operation of the Organic EL Element

Figure 3:
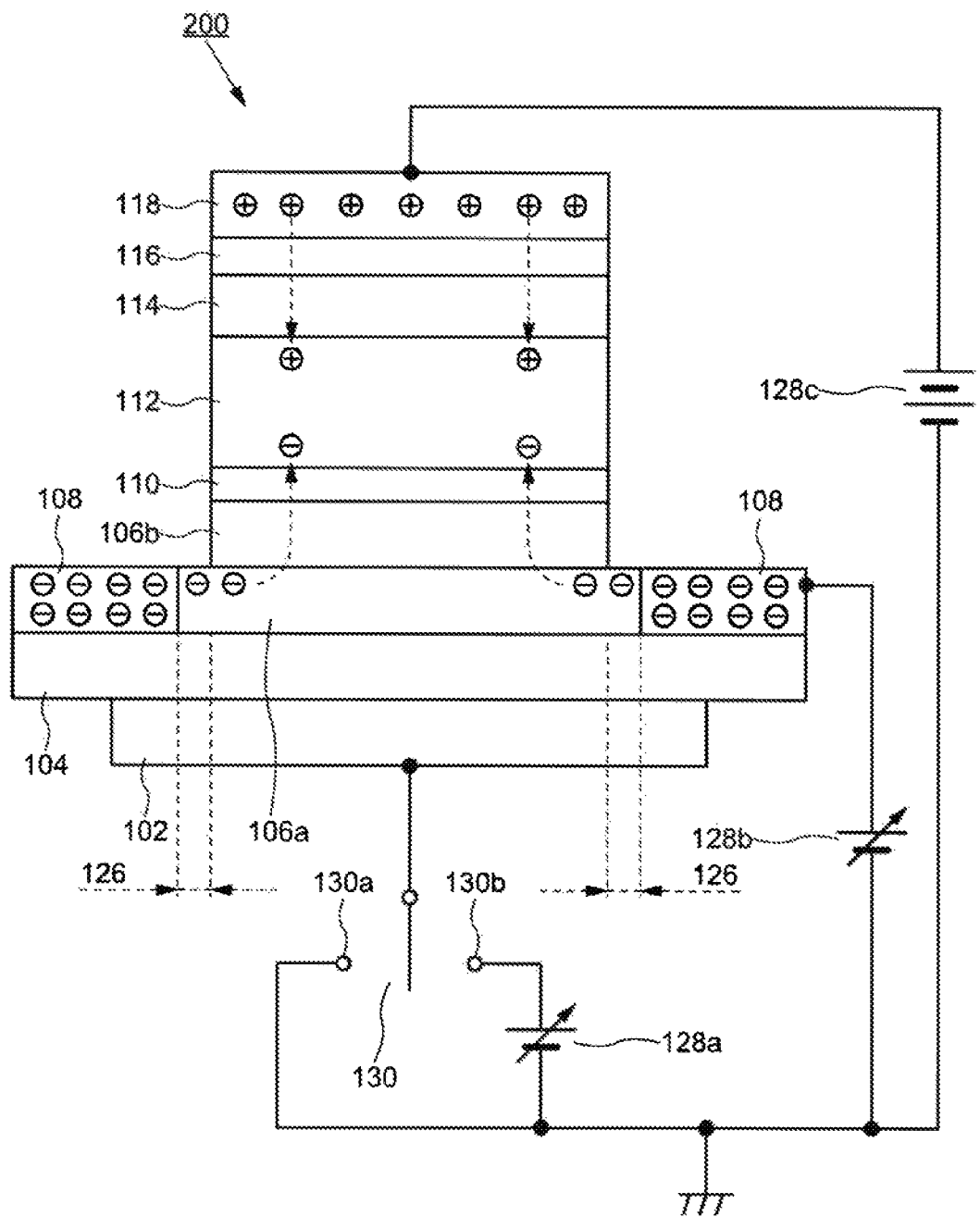
FIG. 3 shows an operation of the organic EL element in an embodiment according to the present invention.
Figure 4:
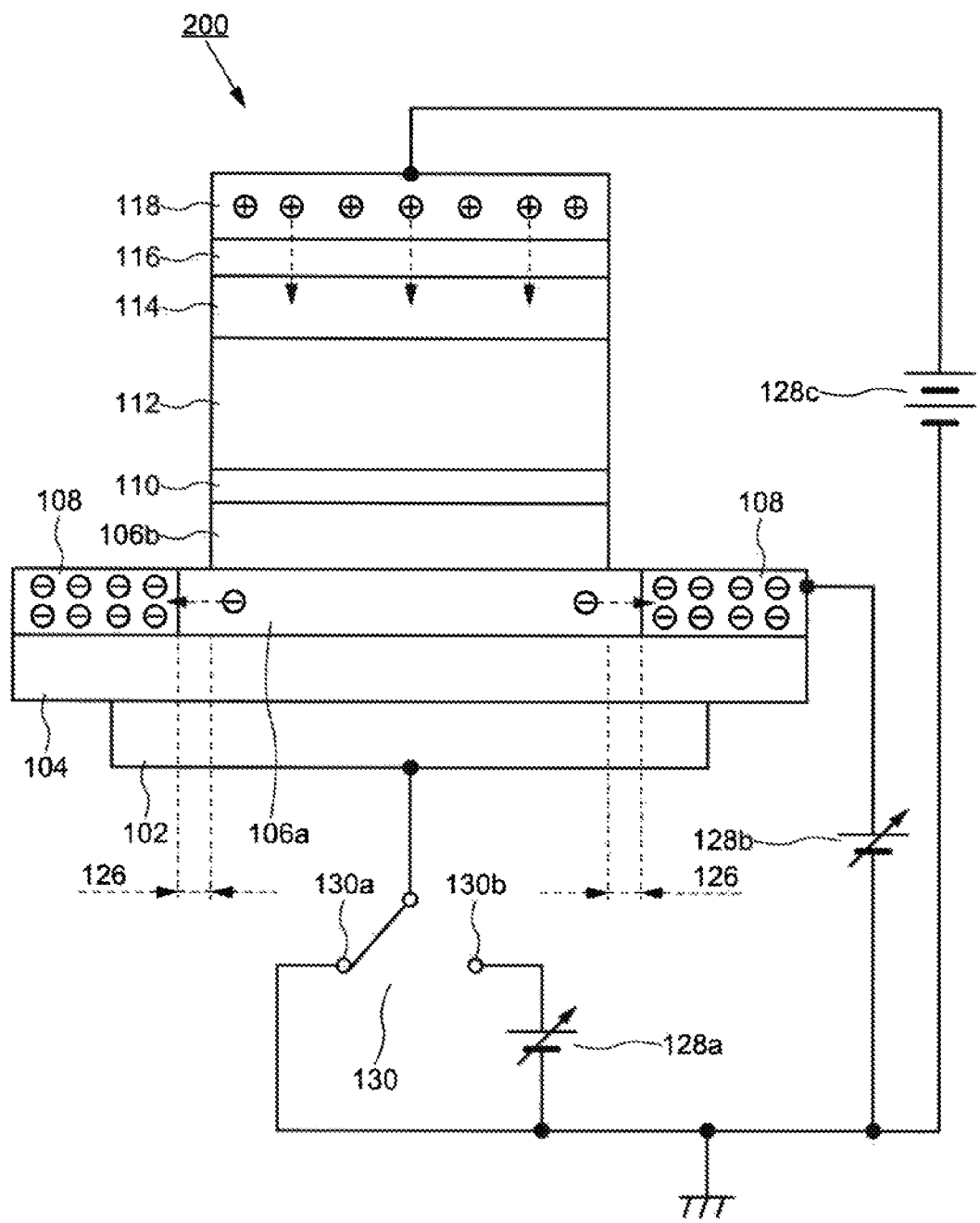
FIG. 4 shows an operation of the organic EL element in an embodiment according to the present invention.
Figure 5:
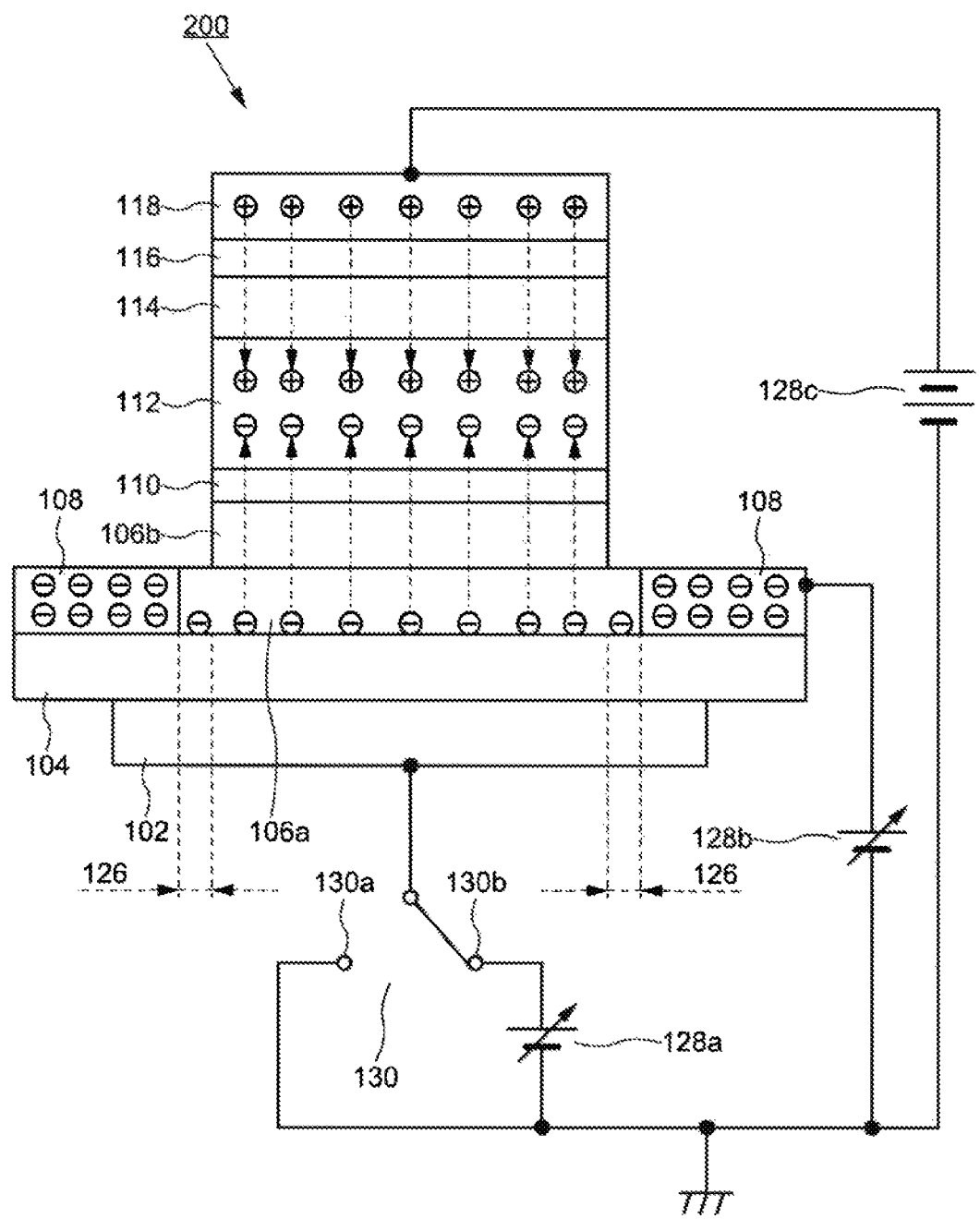
FIG. 5 shows an operation of the organic EL element in an embodiment according to the present invention.

With reference to FIG. 3, FIG. 4 and FIG. 5, an operation of the organic EL element 200 in this embodiment will be described. FIG. 3, FIG. 4 and FIG. 5 show a schematic structure of the organic EL element 200.

3-1. Operation of Light Emission and Light Non-Emission

FIG. 3 schematically shows a structure of the organic EL element 200 in this embodiment. As shown in FIG. 3, the organic EL element 200 in this embodiment includes the second electrode 108, the electron transfer layer 106, the electron injection layer 110, the light emitting layer 112, the hole transfer layer 114, the hole injection layer 116, the third electrode 118, the first insulating layer 104, and the first electrode 102.

The organic EL element 200 is a type of light emitting diode, and emits light by an electric current flowing in a forward direction between the third electrode (positive electrode) 118 and the second electrode (negative electrode) 108. FIG. 3 shows a form in which a third power supply 128c is connected between the third electrode 118 and the ground (earth), a second power supply 128b is connected between the second electrode 108 and the ground (earth), a second switch 130b is connected in series between the first electrode 102 and a first power supply 128a, and a first switch 130a is connected between the first electrode 102 and the ground (earth). The first switch 130a and the second switch 130b are included in a switch 130. FIG. 3 shows a state where the first switch 130a and the second switch 130b of the switch 130 are off, and thus the first electrode 102 is not supplied with a bias voltage.

Namely, FIG. 3 shows a state where the first switch 130a controlling the conductive state between the first electrode 102 and the ground (earth) is off, and the second switch 130b controlling the connection between the first electrode 102 and the first power supply 128a is off. In this state, the organic EL element 200 is forward biased. Therefore, in the case where the bias voltage is at least a light emission start voltage, holes are injected from the third electrode 118 and electrons are injected from the second electrode 108. In the organic EL element 200, a positive voltage is applied between the third electrode 118 and the second electrode 108 by the third power supply 128c. The light emission intensity is controllable by the level of the forward direction electric current flowing in the organic EL element 200.

However, in the structure in which the electron transfer layer 106 and the third electrode 118 are located on the first insulating layer 104 to face each other with the light emitting layer 112 being provided between the electron transfer layer 106 and the third electrode 118, and the second electrode 108 is connected with the peripheral region of the first electron transfer layer 106a, light emission is not provided uniformly in the light emitting region (region where the electron transfer layer 106, the electron injection layer 110, the light emitting layer 112 and the third electrode 118 overlap each other). In this case, the electric field generated between the third electrode 118 and the second electrode 108 is not uniformly distributed in the light emitting region, and the electric field concentrates at the ends of the third electrode 118 and the second electrode 108. In the state where the first switch 130a and the second switch 130b are both off, the carriers (electrons) injected from the second electrode 108 are not uniformly distributed in the plane of the first electron transfer layer 106a. As a result, the light emission is not provided uniformly in the plane of the light emitting region.

In the state shown In FIG. 3, the first switch 130a and the second switch 130b are both off, and therefore, the first electrode 102 is not supplied with a voltage from the second power supply 128b. The carriers (electrons) injected from the second electrode 108 into the first electron transfer layer 106a are not influenced by the first electrode 102, and therefore, do not spread in the central region of the first electron transfer layer 106a. Namely, the carriers (electrons) injected into the peripheral region of the first electron transfer layer 106a are not drifted because the first electrode 102 is not supplied with any voltage, and therefore, do not spread in the central region of the first electron transfer layer 106a. For this reason, in the biased state shown in FIG. 3, the light emitted by the organic EL element 200 is dark in a central region of the light emitting region and bright in a peripheral region of the light emitting region.

FIG. 4 shows a state where the first switch 130a of the switch 130 is on and thus the first electrode 102 obtains a ground potential (earth potential). In this state, no carrier (electron) is present in the first electron transfer layer 106a, and thus the first electron transfer layer 106a is insulated. As a result, no electric current flows in the organic EL element 200, and thus the organic EL element 200 does not emit light (light non-emission).

When, as shown in FIG. 5, a bias voltage is applied in the forward direction between the third electrode 118 and the second electrode 108 of the organic EL element 200 and the second switch 130b is turned on, the electric field generated by the first electrode 102 acts on the first electron transfer layer 106a. Since the first electrode 102 is supplied with a positive voltage, the carriers (electrons) injected from the second electrode 108 into the first electron transfer layer 106a are drifted toward the central region of the first electron transfer layer 106a. Thus, the carriers (electrons) are transferred from the peripheral region to the central region of the first electron transfer layer 106a. The electric field generated by the first electrode 102 supplied with the positive voltage acts to spread the carriers (electrons), injected from the second electrode 108, in the plane of the first electron transfer layer 106a.

The organic EL element 200 is forward biased. Therefore, the carriers (electrons) transferred to the central region of the first electron transfer layer 106a move from the first electron transfer layer 106a toward the light emitting layer 112. The carries (holes) injected from the third electrode 118 and the carriers (electrons) injected from the second electrode 108 are recombined in the light emitting layer 112 to generate excitons. When the excitons in an excited state are transferred to a ground state, photons are released to be observed as light emission.

In the biased state shown in FIG. 5, the amount of the carriers (electrons) to be injected into the first electron transfer layer 106a is controllable by the voltage of the second electrode 108. The voltage of the second electrode 108 may be increased, so that the amount of the carriers (electrons) to be injected into the first electron transfer layer 106a is increased. The amount of the carriers (electrons) to be injected from first electron transfer layer 106a into the light emitting layer 112 is controllable by the voltage of the first electrode 102. The voltage of the first electrode 102 may be increased, so that a large amount of the carriers (electrons) injected from the second electrode 108 are pulled into the central region of the first electron transfer layer 106a to increase the amount of the carriers to be injected into the light emitting layer 112.

In order to cause the light emitting layer 112 to emit light uniformly in the entire plane thereof, it is preferred that the electrons flowing in the second electron transfer layer 106b form a space charge-limited current. In order to realize this, it is preferred that the second electron transfer layer 106b is in an amorphous state, a nanometer-size microcrystalline state, or a mixed state thereof. It is preferred that the first electron transfer layer 106a is a highly dense film containing nanometer-size microscopic crystal.

As described above, the organic EL element 200 in this embodiment includes the first electrode 102 in addition to the third electrode 118 and the second electrode 108 to control the concentration of the carriers to be injected into the light emitting layer 112. FIG. 5 shows an example in which the first electrode 102 is located closer to the second electrode 108. Alternatively, the first electrode 102 may be located closer to the third electrode 118. The organic EL element 200 may further include, in addition to the first electrode 102, a fourth electrode, controlling the amount of the carriers (holes) to be injected, closer to the third electrode 118.

3-2. Control of the Carrier Balance

In order to cause an organic EL element to emit light, holes need to be injected from the positive electrode and electrons need to be injected from the negative electrode. In order to increase the current efficiency (light emission efficiency) of the organic EL element, a good balance needs to be provided such that the amount of the holes transferred from the positive electrode to the light emitting layer and the amount of the electrons transferred from the negative electrode to the light emitting layer match each other (hereinafter, such a balance will be referred to as "carrier balance"). The organic EL element may have a good carrier balance to increase the current efficiency.

However, a conventional organic EL element has a problem that since the light emitting layer has an electron mobility lower than a hole mobility, the carrier balance is destroyed and thus the light emission efficiency is decreased. The organic EL element also has a problem that in the case where the carrier balance is destroyed and as a result, the number of the holes in the light emitting layer is excessive, the holes are accumulated at an interface between the light emitting layer and the electron transfer layer, which promotes the decline in the current efficiency (light emission efficiency). In such a situation, it has been attempted to adjust the materials or the thicknesses of the hole transfer layer and the electron transfer layer to provide a good balance between the holes and the electrons to be injected into the light emitting layer. However, there is a problem that even though the element structure itself of the organic EL element is adjusted, a time-wise change in the light emission characteristics or a temperature change are not followed.

By contrast, the organic EL element 200 in this embodiment controls the carrier balance by the first electrode 102. More specifically, the first electrode 102 provided closer to the electron transfer layer 106 controls the amount of the carries (electrons) to be transferred to the light emitting layer 112 and thus controls the carrier balance. In more detail, the first electrode 102 increases the amount of the electrons to be transferred such that the amount of the electrons to be transferred from the second electrode 108 to the light emitting layer 112 does not become insufficient with respect to the amount of the holes transferred from the third electrode 118 to the light emitting layer 112. In this manner, the number of the holes and the number of the electrons are controlled to be equal to each other. In other words, in the organic EL element 200 in this embodiment, the first electrode 102 increases an electron current flowing from the second electrode 108 to the light emitting layer 112 such that the level of the electron current is equal to the level of a hole current flowing from the third electrode 118 to the light emitting layer 112, and thus keeps a good carrier balance in the light emitting layer 112.

Figure 6:
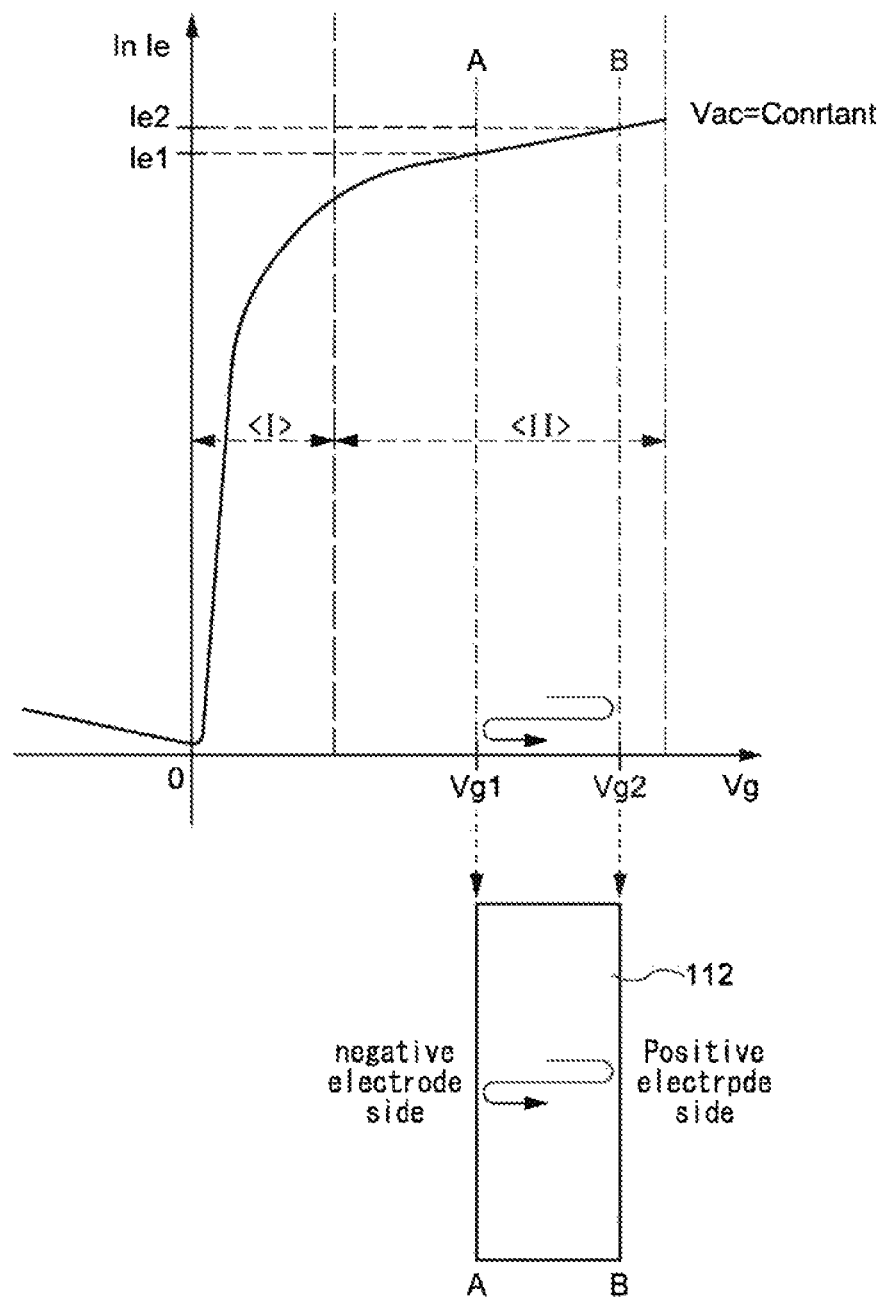
FIG. 6 is a graph showing an example of operation characteristics of the organic EL element in an embodiment according to the present invention.

FIG. 6 is a graph regarding the organic EL element 200, schematically showing the electron current (Ie) flowing between the third electrode 118 and the second electrode 108 when the voltage (Vg) to be applied to the first electrode 102 is changed while the voltage (Vac) to be applied between the third electrode 118 and the second electrode 108 is kept at the same level. As shown in FIG. 6, when the voltage (Vg) to be applied to the first electrode 102 is 0 V, the level of the electron current (Ie) is low, and the light emission in the entire plane of the organic EL element 200 is not observed. When the voltage of the first electrode 102 is increased from this state, the carriers (electrons) injected from the second electrode 108 into the electron transfer layer 106a form the electron current (Ie) and flows from the first electron transfer layer 106a toward the light emitting layer 112. At this point, the electron current (Ie) exponentially increases like the forward direction electric current of a diode ("region I" in FIG. 6).

When the voltage (Vg) to be applied to the first electrode 102 is further increased, there is a tendency that the amount of increase in the electron current (Ie) with respect to the amount of change in the voltage (Vg) is saturated. As a result, the gradient of the curve representing the Ie vs. Vg characteristic becomes slow ("region II" in FIG. 6). When the level of the voltage (Vg) to be applied to the first electrode 102 in "region II" is changed between a first voltage (Vg1) and a second voltage (Vg2), the level of the electron current (Ie) is changed between a first current (Ie1) and a second current (Ie2). The region where the voltage (Vg) of the first electrode 102 changes between the first voltage (Vg1) and the second voltage (Vg2) is a region where the level of the electron current (Ie) does not rapidly change, and is a region where the light emission intensity of the organic EL element 200 is almost saturated.

The change in the level of the electron current (Ie) indicates that the amounts of the holes and the electrons to be injected into the light emitting layer 112 are increased or decreased. When the voltage (Vg) of the first electrode 102 is changed between the first voltage (Vg1) and the second voltage (Vg2), the amount of the electrons to be injected into the light emitting layer 112 is changed. Namely, the voltage (Vg) of the first electrode 102 may be changed to control the carrier balance between the electrons and the holes in the light emitting layer 112. The amount of the electrons to be injected into the light emitting layer 112 may be changed, so that the central position of the region where the electrons and the holes are recombined (position of the light emitting region in the thickness direction of the light emitting layer 112) is shifted. For example, when the first electrode 102 has the first voltage (Vg1), the level of the electron current becomes lower than the level of the hole current, and the position of the light emitting region in the light emitting layer 112 is shifted toward the negative electrode ("A side" in FIG. 6). By contrast, when the first electrode 102 has the second voltage (Vg2), the level of the electron current becomes higher than the level of the hole current, and the position of the light emitting region in the light emitting layer 112 is shifted toward the positive electrode ("B side" in FIG. 6).

As described above, the organic EL element 200 controls the position of the light emitting region in the thickness direction of the light emitting layer 112 by the voltage of the first electrode 102. For example, when the voltage of the first electrode 102 is changed between the first voltage (Vg1) and the second voltage (Vg2), the position of the light emitting region in the light emitting layer 112 is swung between the negative electrode side A and the positive electrode side B. The voltage of the first electrode 102 may be controlled, so that the entirety of the light emitting layer 112 is used uniformly as the light emitting region. In this case, the entire region of the light emitting layer 112 is usable as the light emitting region, and therefore, the lifetime until the luminance is deteriorated (e.g., time until the luminance is decreased to 70% of the initial luminance) is extended. The voltage of the first electrode 102 may be changed between Vg1 and Vg2 shown in FIG. 6, and the intensity of the luminance may be controlled by the potential difference (voltage) between the second electrode 108 and the third electrode 118.

As described above, in the organic EL element 200 in this embodiment, the electron transfer layer 106 is formed of an oxide semiconductor layer, the first electrode 102 controlling the amount of the carriers is located to face the electron transfer layer 106 with the first insulating layer 104 being provided between the first electrode 102 and the electron transfer layer 106, and the third electrode 118 as the positive electrode is located to face the first electrode 102. With such a structure, the amount of the electrons to be injected into the light emitting layer 112 is controlled. The organic EL element 200 in this embodiment controls the carrier balance between the electrons and the holes in the light emitting layer 112 by the action of the first electrode 102 controlling the amount of the carriers to be injected. As a result, the organic EL element 200 improves the current efficiency and extends the life thereof.

With the structure of the conventional organic EL element, the light emitting layer is not deteriorated uniformly in the thickness direction thereof but is deteriorated non-uniformly. Therefore, it is difficult to suppress the decline in the luminance, and the life of the organic EL element is not extended. By contrast, the organic EL element 200 in this embodiment according to the present invention controls the voltage of the first electrode 102 to cause the entirety of the light emitting layer 112 to act as the light emitting region, and thus uniformly deteriorates the light emitting layer 112 in the entirety in the thickness direction thereof. Therefore, the life of the organic EL element 200 against the decline in the luminance is extended. For this reason, even if the thickness of the light emitting layer 112 is increased to 1.5 to 3.0 times, namely, to 45 nm to 90 nm from the conventional thickness (e.g., 30 nm), the light emitting layer 112 emits light in the entirety of the thickness direction thereof. Thus, the life of the organic EL element 200 is further extended.

4. Method for Producing the Organic EL Element

An example of method for producing the organic EL element 200 in this embodiment will be described with reference to FIG. 7A to FIG. 7C, FIG. 8A, FIG. 8B, FIG. 9A and FIG. 9B. Hereinafter, a method for producing the organic EL element 200a of the bottom-emission type shown in FIG. 1 will be described.

Figure 7A:
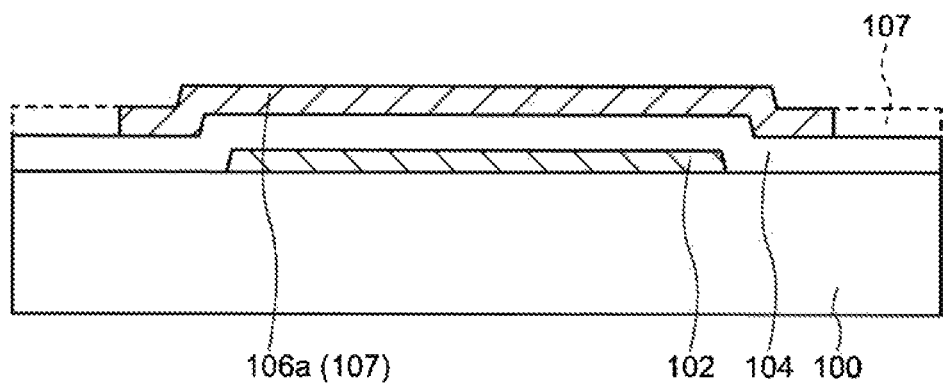
FIG. 7A to FIG. 7C show a method for producing the organic EL element in an embodiment according to the present invention.

FIG. 7A shows a step of forming the first electrode 102, the first insulating layer 104 and the electron transfer layer 106 on the substrate 100. As the substrate 100, a transparent insulating substrate, for example, is used. Examples of the transparent insulating substrate include an alkali-free glass substrate formed of aluminosilicate glass, aluminoborosilicate glass or the like, and a quartz substrate. Alternatively, the transparent insulating substrate may be a resin substrate formed of polyimide resin, acrylic resin, epoxy resin or the like.

The first electrode 102 is formed of a transparent conductive film of indium tin oxide (ITO), indium zinc oxide (IZO) or the like. The transparent conductive film is formed by sputtering to have a thickness of 30 nm to 200 nm. The first electrode 102 is formed by forming a resist mask on a transparent conductive film, formed on a first surface of the substrate 100, by photolithography and performing etching. It is preferred that the first electrode 102 has a tapered end surface as seen in a cross-sectional view.

The first insulating layer 104 is formed of an inorganic insulating film such as a silicon oxide film, a silicon nitride film, a silicon oxide nitride film or the like. The inorganic insulating film is formed by plasma CVD (Chemical Vapor Deposition) or sputtering. The first insulating film 104 is formed to have a thickness of about 100 nm to about 500 nm. The first insulating layer 104 is formed to bury the first electrode 102. In the case where the end surface of the first electrode 102 is tapered, the first insulating film 104 covers the first electrode 102 including the stepped portion with certainty.

The first electron transfer layer 106a is formed of an oxide semiconductor material. The first electron transfer layer 106a is formed by subjecting a target, formed by sintering a metal oxide, to sputtering. An oxide semiconductor film 107 is formed on the first insulating layer 104 by sputtering, such that the oxide semiconductor film 107 overlaps the first electrode 102 and a peripheral region thereof is located outer to the first electrode 102. The oxide semiconductor film 107 is formed by sintering to have a thickness of 20 nm to 200 nm, for example, 30 nm to 50 nm.

The first electron transfer layer 106a is formed of a metal oxide material. It is preferred to use a tin (Sn)-based oxide semiconductor material ($InGaSnO_x$, $InWSnO_x$, or $InSiSnO_x$) that does not contain zinc (Zn), magnesium (Mg) or the like as described above. Regarding the tin (Sn)-based oxide semiconductor material, as long as tin (Sn) is contained at a content of 10 atm % or higher, even if zinc (Zn) is contained, the composition change of zinc (Zn) is small. Therefore, incorporation of zinc (Zn) is not completely excluded.

Figure 7B:
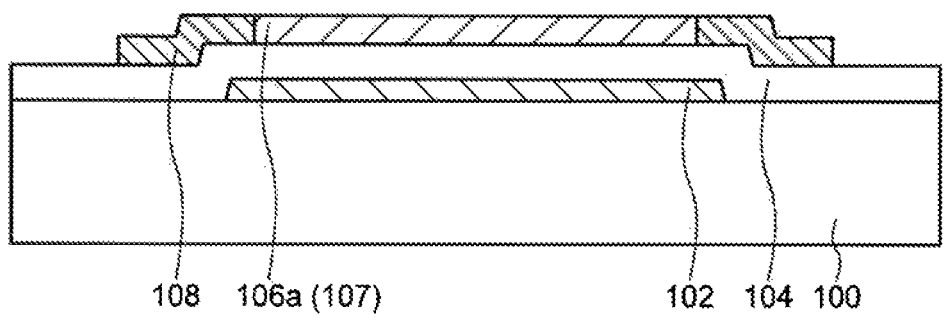

FIG. 7B shows a step of forming the second electrode 108. The second electrode 108 is formed of a part of the oxide semiconductor film 107 used to form the first electron transfer layer 106a. Specifically, a region, of the oxide semiconductor film 107 used to form the electron transfer layer 106a, that corresponds to the second electrode 108 is decreased in the resistance, and thus the second electrode 108 is formed. The oxide semiconductor film 107 is decreased in the resistance by causing oxygen deficiency. The oxygen deficiency in the oxide semiconductor material is caused by laser irradiation, plasma processing or the like. According to the laser irradiation, the oxide semiconductor film 107 is irradiated with laser light to cause the oxygen deficiency. The oxide semiconductor film 107, when being irradiated with the laser light, is heated to cause defects such as the oxygen deficiency or the like. The oxygen deficiency in the oxide semiconductor film 107 is a donor defect, and therefore, increases the electric conductivity.

Figure 8A:
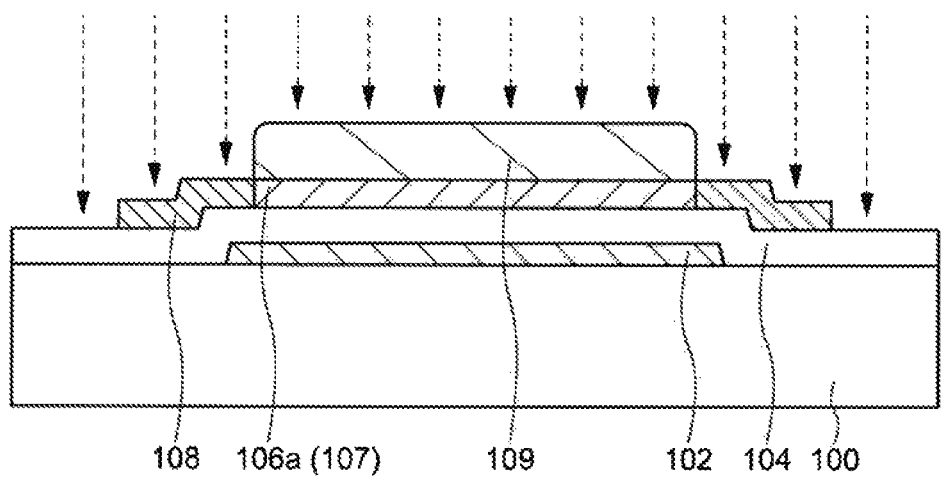
FIG. 8A and FIG. 8B show the method for producing the organic EL element in an embodiment according to the present invention.

FIG. 8A shows a form in which the surface at which the first electron transfer layer 106a is formed is subjected to laser irradiation or plasma processing. In this case, a region corresponding to the first electron transfer layer 106a is covered with a mask layer 109 such that oxygen deficiency is not caused in this region. The mask layer 109 is formed of an organic resin material such as a photoresist or the like or of an inorganic insulating material such as silicon oxide or the like. Such laser processing or plasma processing causes the oxygen deficiency in the region exposed from the mask layer 109. For the laser irradiation, a KrF excimer laser (wavelength: 248 nm), an XeCl excimer laser (wavelength: 308 nm), an XeF excimer laser (wavelength: 351 nm) or the like is used as the laser light source. For the plasma processing, a plasma processing device capable of generating glow discharge plasma of hydrogen is used. Hydrogen plasma is directed toward the oxide semiconductor film 107 to advance a reduction reaction, and thus the oxygen deficiency is caused. Alternatively, the oxygen deficiency may be caused in the oxide semiconductor film 107 by plasma processing using noble gas such as helium (He), neon (Ne), argon (Ar) or the like, or by ion implantation processing or plasma doping of injecting nitrogen ion.

Figure 8B:
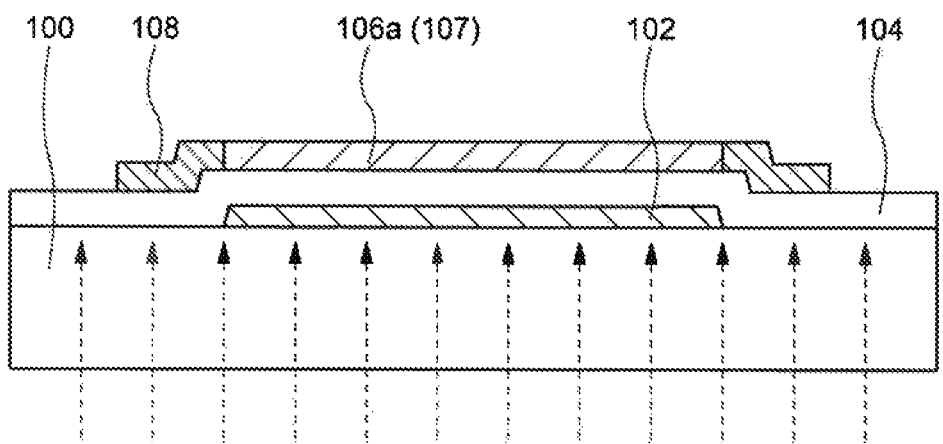

FIG. 8B shows a form in which the substrate 100 is irradiated with laser light to form a low-resistance region in the oxide semiconductor film 107. Laser light emitted from an ultraviolet laser light source such as a KrF excimer laser (wavelength: 248 nm), an XeCl excimer laser (wavelength: 308 nm), an XeF excimer laser (wavelength: 351 nm) or the like is not transmitted through the region where the first electrode 102 is formed, but is directed toward the oxide semiconductor film 107 in the other region. In the case where the substrate 100 is irradiated with the ultraviolet laser light, the first electrode 102 is usable as a mask (light blocking film) against the laser light. In this manner, the second electrode 108 is formed in a self-aligned manner with respect to the first electrode 102. More specifically, in the case where a rear surface of the substrate 100 is irradiated with the laser light, the second electrode 108 is formed such that the end of the second electrode 108 and the end of the first electrode 102 generally match each other.

As shown in FIG. 8A and FIG. 8B, a part of the oxide semiconductor film 107 used to form the first electron transfer layer 106a is decreased in the resistance, and thus the second electrode 108 is formed without forming any other thin film. The laser processing and the plasma processing may be performed at room temperature, which simplifies the production process of the organic EL element 200a.

Figure 7C:
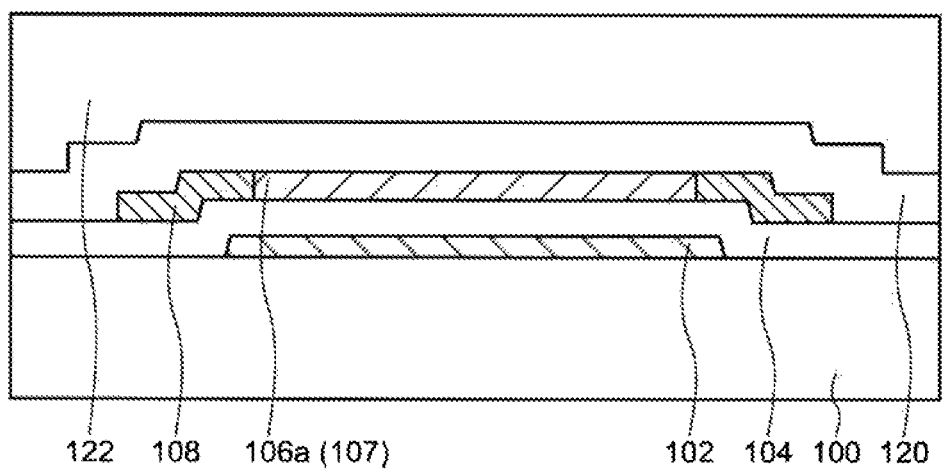

FIG. 7C shows a step of forming the second insulating layer 120 and the third insulating layer 122 on the first electron transfer layer 106a and the second electrode 108. The second insulating layer 120 and the third insulating layer 122 are formed of an inorganic insulating material, like the first insulating layer 104. Alternatively, the third insulating layer 122 may be formed of an organic insulating material such as polyimide resin, acrylic resin, epoxy resin or the like. The second insulating layer 120 and the third insulating layer 122 are each formed to have a thickness of 100 nm to 5000 nm. In the case where, for example, the third insulating layer 122 is flattened, it is preferred that the third insulating layer 122 is formed to have a thickness of 2000 nm to 5000 nm.

Figure 9A:
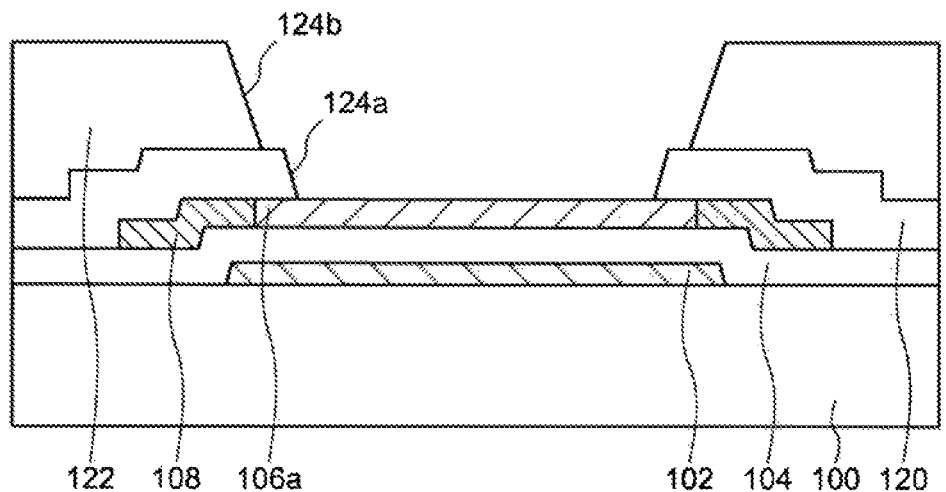
FIG. 9A and FIG. 9B show the method for producing the organic EL element in an embodiment according to the present invention.

FIG. 9A shows a step of forming the opening 124b in the third insulating layer 122 and forming the opening 124a in the second insulating layer 120. The opening 124b and the opening 124a may be formed by etching the third insulating layer 122 and the second insulating layer 120 continuously. The third insulating layer 122 and the second insulating layer 120 may be etched separately in order to form the opening 124b and the opening 124a with different widths. In the case where the third insulating layer 122 is formed of a photosensitive organic resin material, the third insulating layer 122 may be subjected to exposure to light with a photomask and to developing, so that the opening 124b is formed. In either case, it is preferred that the opening 124b and the opening 124a are each formed to have a tapered inner surface in the production of the organic EL element 200a.

Figure 9B:
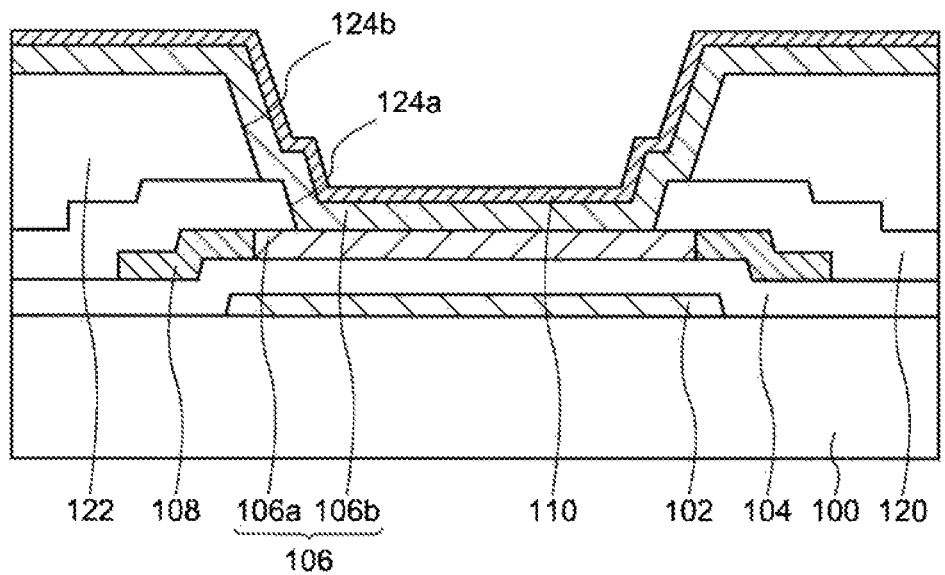

FIG. 9B shows a step of forming the second electron transfer layer 106b and the electron injection layer 110. The second electron transfer layer 106b is formed of a metal oxide material. It is preferred that the second electron transfer layer 106b is formed of a zinc (Zn)-based oxide semiconductor material ($ZnSiO_x$, $ZnGeO_x$, $ZnMgO_x$, $MgGaO_x$, $ZnGaO_x$ or the like) that does not contain tin (Sn). In other words, it is preferred that the second electron transfer layer 106b contains zinc oxide and at least one selected from silicon oxide, germanium oxide, magnesium oxide and gallium oxide. The second electron transfer layer 106b may be formed by sputtering using a sputtering target formed by sintering a metal oxide, atomic layer deposition (ALD) or mist CVD (Mist Chemical Vapor Deposition).

The electron injection layer 110 is formed of, for example, C12A7 electride. The electron injection layer 110 may be formed by sputtering using C12A7 electride as a sputtering target. As sputter gas, at least one selected from the group consisting of He (helium), Ne (neon), $N_2$ (nitrogen), Ar (argon), NO (nitrogen monoxide), Kr (krypton) and Xe (xenon) is used.

Alternatively, the electron injection layer 110 may be formed of magnesium zinc oxide ($Mg_xZn_yO$). For example, $Mg_{0.3}Zn_{0.7}O$ has a small work function of 3.0 eV and is stable in the air, and thus is usable for the electron injection layer 110.

The second electron transfer layer 106b and the electron injection layer 110 are both formed by sputtering and thus may be formed continuously in vacuum. The second electron transfer layer 106b and the electron injection layer 110 are formed to cover the opening 124a and the opening 124b. The second electron transfer layer 106b is formed to contact the first electron transfer layer 106a at a bottom of the opening 124a and also to contact the second insulating layer 120 and the third insulating layer 122.

Then, the light emitting layer 122, the hole transfer layer 114, the hole injection layer 116 and the third electrode 118 are formed, and thus the organic EL element 200a shown in FIG. 1 is produced. The light emitting layer 112 is formed by vacuum vapor deposition or printing. As shown in FIG. 1, the light emitting layer 112 may be formed independently for one organic EL element 200a, or may be formed continuously for a plurality of organic EL elements 200a formed on the same plane. The hole transfer layer 114 and the hole injection layer 116 are formed by vacuum vapor deposition or coating. Since the organic EL element 200a is of the bottom-emission type, the third electrode 118 is formed by sputtering by first forming a transparent conductive film of indium tin oxide (ITO) or the like and then stacking a metal film of aluminum (Al) or the like on the transparent conductive film.

As described above, in this embodiment, the thin films are stacked to produce the organic EL element 200. The organic EL element 200 in this embodiment has the reverse stacking structure, in which the films and layers are stacked from the negative electrode side. Since the electron transfer layer 106 and the electron injection layer 110 are formed of a metal oxide, the organic EL element 200 is not easily damaged during the production thereof. Since the second electrode 108 is formed in the same layer as the electron transfer layer 106 with no use of any alkaline metal material, the load during the production process is decreased, and thus the organic EL element 200 is chemically stable.

Second Embodiment

In this embodiment, an organic EL element in which the negative electrode has a structure different from that of the organic EL element 200 in embodiment 1 will be described. Hereinafter, portions different from those in embodiment 1 will be described, and portion common to those in embodiment 1 will not be described.

Figure 10:
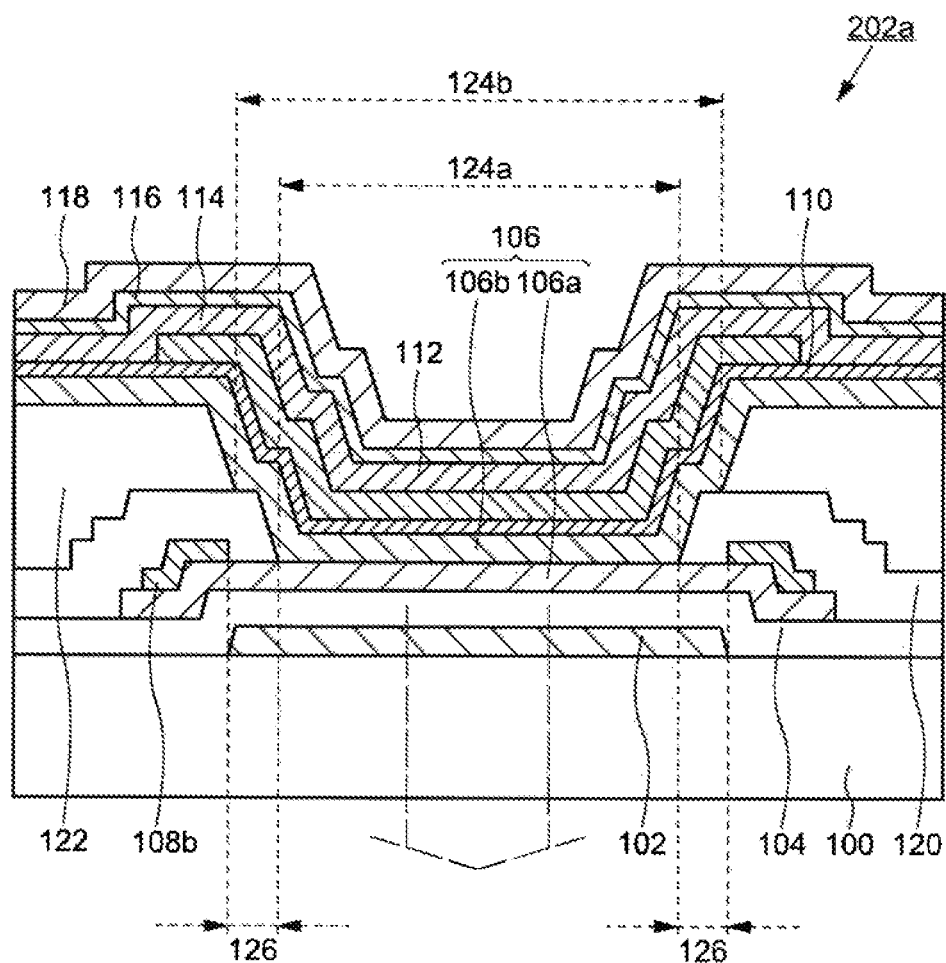
FIG. 10 is a cross-sectional view showing a structure of an organic EL element in an embodiment according to the present invention.

FIG. 10 shows a cross-sectional structure of an organic EL element 202a in this embodiment. In the organic EL element 202a, the first electron transfer layer 106a is wider than the first electrode 102. At least a part of an outer peripheral region of the first electron transfer layer 106a is located outer to the first electrode 102. With such a structure, the first electron transfer layer 106a includes a region overlapping the first electrode 102 with the first insulating layer 104 being provided between the first electron transfer layer 106a and the first electrode 102 and also includes a region not overlapping the first electrode 102. The region not overlapping the first electrode 102 is located outer to the region overlapping the first electrode 102. A second electrode 108b is located on a surface of the first electron transfer layer 106a that is opposite to the first insulating layer 104. The second electrode 108b is located on the region of the first electron transfer layer 106a that does not overlap the first electrode 102, namely, is located between an end of the first electron transfer layer 106a and the end of the first electrode 102.

The first electron transfer layer 106a is formed of a metal oxide material, a metal nitride material or a metal oxide nitride material, like in embodiment 1. It is preferred that the first electron transfer layer 106a is formed of an oxide semiconductor material. The second electrode 108b is formed of a conductive material that may be put into ohmic contact with the first electron transfer layer 106a. Examples of such a conductive material include a metal material, a metal oxide material, a metal nitride material and a metal oxide nitride material.

The metal material usable to form the second electrode 108b may be a metal material having a high affinity with oxygen, for example, titanium (Ti), molybdenum (Mo), tungsten (W), tantalum (Ta), cobalt (Co) or the like. For example, the second electrode 108b may be formed of titanium (Ti) and may be in contact with the first electron transfer layer 106a formed of an oxide semiconductor material. In this case, titanium (Ti), which has a high affinity with oxygen, acts to draw oxygen from the oxide semiconductor material to cause oxygen deficiency in the oxide semiconductor material. When oxygen is drawn from the oxygen semiconductor material, a donor level is formed in the oxygen semiconductor material, and thus the resistance of the oxygen semiconductor material is decreased. As a result, the second electrode 108b and the first electron transfer layer 106a form an ohmic contact.

Examples of the metal oxide material usable to form the second electrode 108b include indium tin oxide ($In_2O_3 \cdot SnO_2$; ITO), indium zinc oxide ($In_2O_3 \cdot ZnO$; IZO), tin oxide ($SnO_2$), titanium oxide ($TiO_x$), and the like. Examples of the metal nitride material usable to form the second electrode 108b include titanium nitride ($TiN_x$), zirconium nitride ($ZrN_x$), and the like. Examples of the metal oxide nitride material usable to form the second electrode 108b include titanium oxide nitride ($TiO_xN_y$), tantalum oxide nitride ($TaO_xN_y$), zirconium oxide nitride ($ZrO_xN_y$), hafnium oxide nitride ($HfO_xN_y$), and the like. A trace amount of metal element improving the conductivity may be added to such a metal oxide material, such a metal nitride material and such a metal oxide nitride material. For example, niobium (Nb)-doped titanium oxide ($TiO_x$:Nb) may be used. The second electrode 108b may be formed of such a metal oxide material, such a metal nitride material or such a metal oxide nitride material, so that an ohmic contact is formed between the second electrode 108b and the first electron transfer layer 106a, which is formed of a metal oxide material. Alternatively, the second electrode 108b may be formed of a silicide compound of a metal material having a high melting point such as molybdenum silicide ($MoSi_x$), tungsten silicide ($WSi_x$), zirconium silicide ($ZrSi_x$) or the like.

The organic EL element 202a includes the second electrode 108b provided in contact with the surface of the first electron transfer layer 106a. With such a structure, the contact area size between the second electrode 108b and the first electron transfer layer 106a is made large. This decreases the series resistance component of the organic EL element 202a and decreases the driving voltage. The organic EL element 202a also decreases the density of the electric current flowing into the second electrode 108b.

Figure 11:
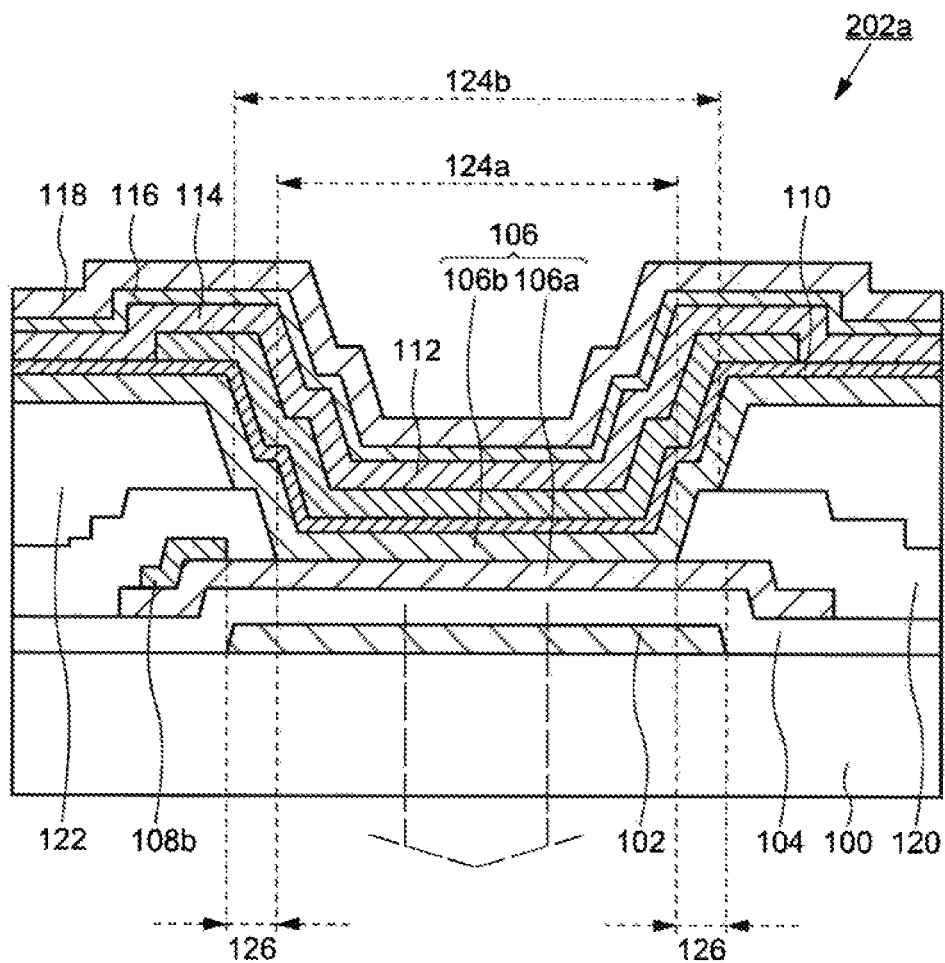
FIG. 11 is a cross-sectional view showing a structure of an organic EL element in an embodiment according to the present invention.

It is preferred that the second electrode 108b is provided to enclose the first electron transfer layer 106a. With such a positional arrangement of the second electrode 108b, the length from the central region of the first electron transfer layer 106a to the second electrode 108b is made uniform along the entire perimeter of the first electron transfer layer 106a. The organic EL element 202a in this embodiment is not limited to having such a positional arrangement. The second electrode 108b merely needs to be provided on a part of the peripheral region of the first electron transfer layer 106a. For example, as shown in FIG. 11, the second electrode 108b may be provided on a part of the peripheral region of the first electron transfer layer 106a. In the case where the resistance of the first electron transfer layer 106a is low (in the case where the carrier concentration (electron concentration) is high), the second electrode 108b may be provided to contact a part of the first electron transfer layer 106a as shown in FIG. 11.

Figure 12:
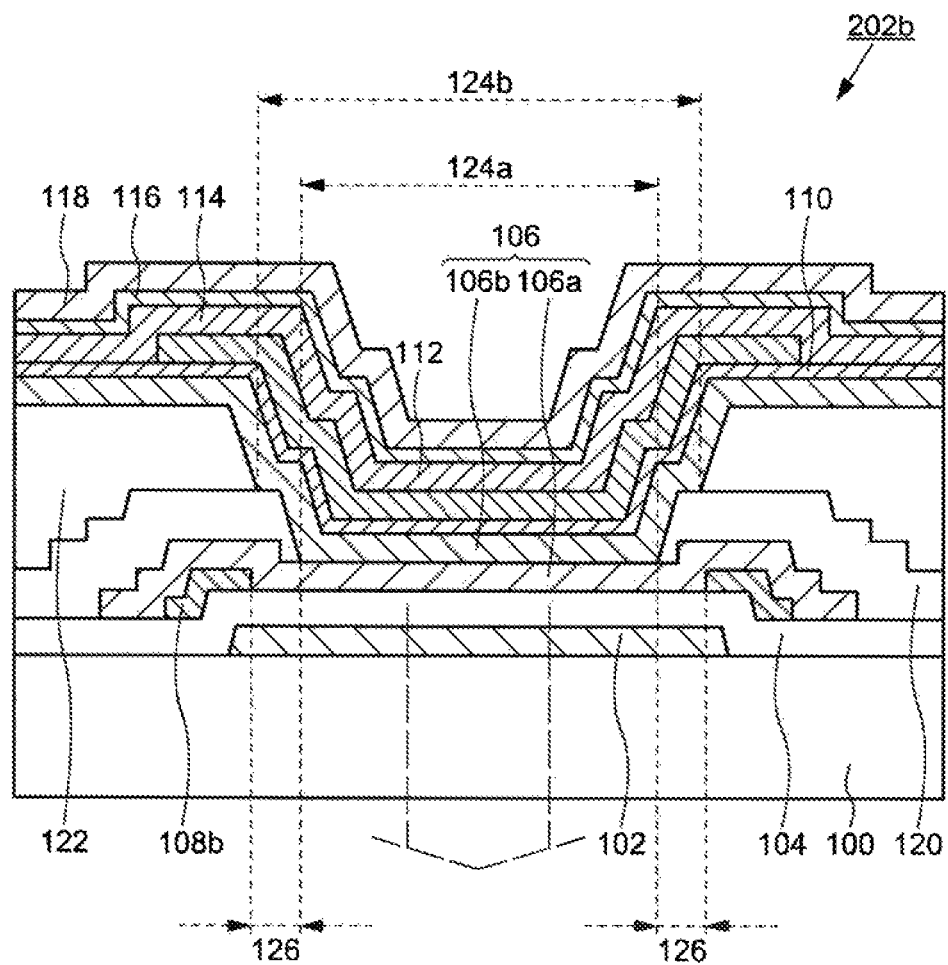
FIG. 12 is a cross-sectional view showing a structure of an organic EL element in an embodiment according to the present invention.

FIG. 12 shows a cross-sectional structure of an organic EL element 202b in this embodiment. Unlike in the organic EL element 202a shown in FIG. 10, in the organic EL element 202b, the second electrode 108b is provided in contact with the first insulating layer 104, and the first electron transfer layer 106a is provided to cover the second electrode 108b. The second electrode 108b is provided in contact with the first insulating layer 104, and therefore, has an increased selection ratio at the time of etching and is easily patterned as the negative electrode. In this specification, the organic EL element 202a and the organic EL element 202b may be collectively referred to as the "organic EL element 202".

In the organic EL element 202b, a top surface of the second electrode 108b is in contact with the first electron transfer layer 106a, and thus the contact area size between the second electrode 108b and the first electron transfer layer 106a is increased. With such a structure, the organic EL element 202b is decreased in the series resistance component and thus is decreased in the driving voltage. The organic EL element 202b is also decreased in the density of the electric current flowing into the second electrode 108b. In the organic EL element 202b, the second electrode 108b is formed before the first electron transfer layer 106a is formed. Therefore, a region of the first electron transfer layer 106a where there are only few surface defects is in contact with the second electrode 108b. In the case where the second electrode 108b is located at the position shown in FIG. 12, the second electrode 108b may be located in contact with a part of the peripheral region of the first electron transfer layer 106a as described above with reference to FIG. 11.

The organic EL elements 202 in this embodiment is substantially the same as the organic EL element 200 in embodiment 1 except for the structure of the second electrode 108b and the first electron transfer layer 106a, and provide substantially the same function and effect as those of the organic EL element 200.

Third Embodiment

In this embodiment, an organic EL element in which the second electrode 108 and the electron transfer layer 106 have a different structure as that of the organic EL element 200 in embodiment 1 will be described. Hereinafter, portions different from those in embodiment 1 will be described, and portion common to those in embodiment 1 will not be described.

Figure 13:
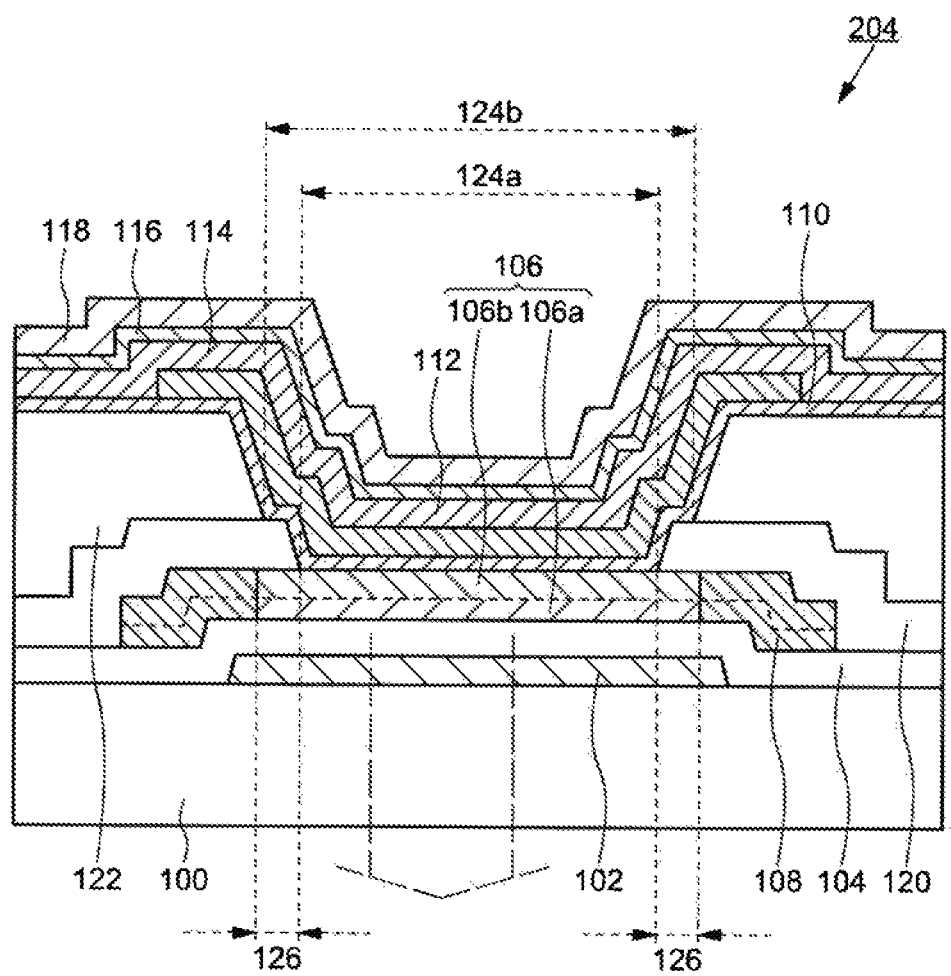
FIG. 13 is a cross-sectional view showing a structure of an organic EL element in an embodiment according to the present invention.

FIG. 13 shows a cross-sectional structure of an organic EL element 204 in this embodiment. Unlike in the organic EL elements 200 in embodiment 1 and embodiment 2, in the organic EL element 204, the first electron transfer layer 106a and the electron transfer layer 106b of the electron transfer layer 106 are stacked on each other with no insulating layer being provided between the electron transfer layers 106a and 106b, and are located on the first insulating layer 104. The first electron transfer layer 106a and the electron transfer layer 106b are stacked on each other. The second electron transfer layer 106b is provided below the second insulating layer 120 and is exposed by an opening 124 of the second insulating layer 120. The second electron transfer layer 106b is in contact with the electron injection layer 110 in the opening 120.

It is preferred that the first electron transfer layer 106a and the second electron transfer layer 106b are formed with different compositions. Like in embodiment 1, it is preferred that the first electron transfer layer 106a is formed of a tin (Sn)-based oxide semiconductor material (InGaSnO$_x$, InWSnO$_x$, or InSiSnO$_x$) that does not contain zinc (Zn), magnesium (Mg) or the like. Like in embodiment 1, it is preferred that the second electron transfer layer 106b is formed of a zinc (Zn)-based oxide semiconductor material (ZnSiO$_x$, ZnMgO$_x$, ZnGaO$_x$ or the like) that does not contain tin (Sn).

As shown in FIG. 13, the structure in which the first electron transfer layer 106a and the second electron transfer layer 106b stacked on each other with no insulating layer being provided between the electron transfer layers 106a and 106b simplifies the production process. The first electron transfer layer 106a and the second electron transfer layer 106b may be formed continuously by sputtering. The first electron transfer layer 106a and the second electron transfer layer 106b may be patterned at the same time by photolithography.

The second electrode 108 is formed by decreasing the resistance of a part of each of the first electron transfer layer 106a and the second electron transfer layer 106b. Although not shown, the second electrode 108 may be formed of a metal material, a metal oxide material, a metal nitride material, or a metal oxide nitride material like the second electrode 108b described above with reference to FIG. 10 or the like.

The organic EL element 204 in this embodiment has a structure in which the first electron transfer layer 106a and the second electron transfer layer 106b are stacked on each other with no insulating layer being provided between the electron transfer layers 106a and 106b, and thus is simplified in the structure and the production process. The organic EL element 204 is substantially the same as the organic EL element 200 in embodiment 1 except for the structure of the second electrode 108, the first electron transfer layer 106a and the second electron transfer layer 106b, and provides substantially the same function and effect as those of the organic EL element 200.

Fourth Embodiment

In this embodiment, an organic EL element in which the second electron transfer layer 106b and the electron injection layer 110 have a different structure as that of the organic EL element 200 in embodiment 1 will be described. Hereinafter, portions different from those in embodiment 1 will be described, and portion common to those in embodiment 1 will not be described.

Figure 14:
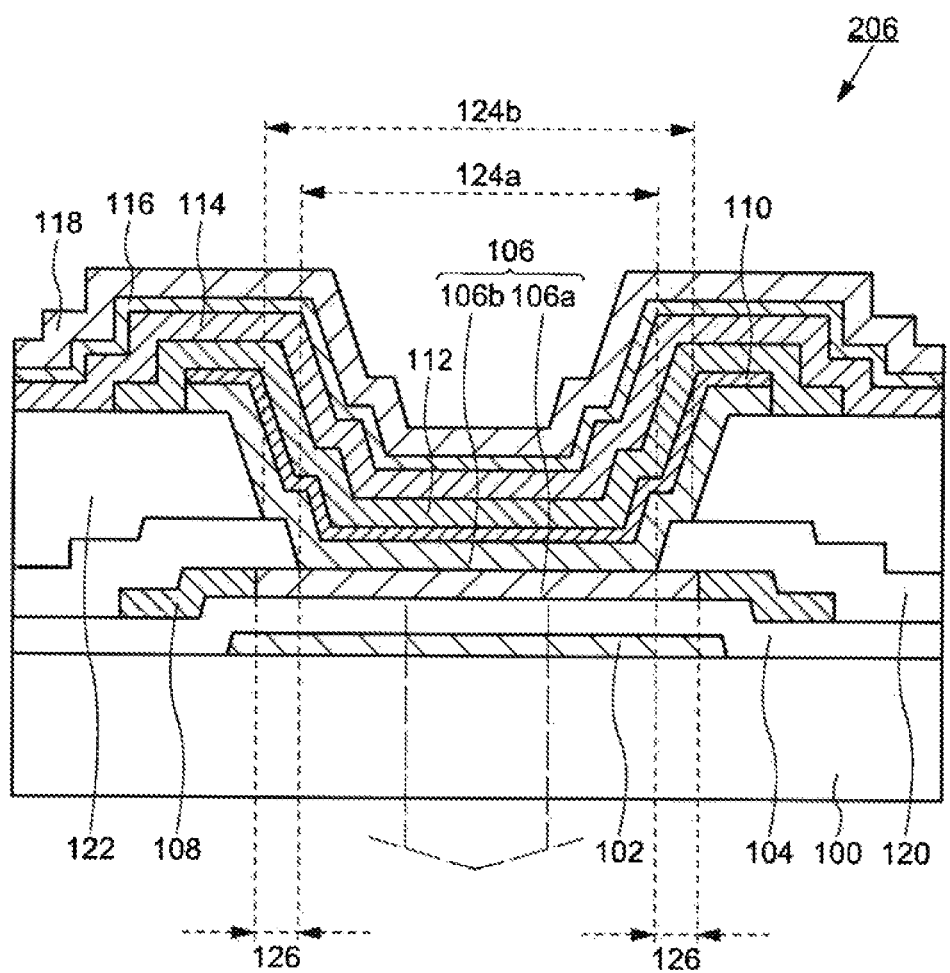
FIG. 14 is a cross-sectional view showing a structure of an organic EL element in an embodiment according to the present invention.

FIG. 14 shows a cross-sectional structure of an organic EL element 206 in this embodiment. Unlike in the organic EL element 200 in embodiment 1, in the organic EL element 206, the second electron transfer layer 106b and the electron injection layer 110 are patterned in accordance with the positional arrangement of the opening 124a of the second insulating layer 120 and the opening 124b of the third insulating layer 122.

The second electron transfer layer 106b and the electron injection layer 110 are provided to cover the openings 124a and 124b. Ends of the second electron transfer layer 106b and the electron injection layer 110 are located on the third insulating layer 122 and inner to an end of the light emitting layer 112. Such a structure is provided as follows: before the light emitting layer 112 is formed, the second electron transfer layer 106b and the electron injection layer 110 are formed by patterning by use of photolithography and etching.

As described above in embodiment 1, the second electron transfer layer 106b has a carrier concentration (electron concentration) in the range of $10^{11}$/cm$^3$ to $10^{17}$/cm$^3$, and has semiconductor characteristics. With the structure in which the second electron transfer layer 106b, which has semiconductor characteristics, is not exposed to an end of the organic EL element 206 as a unit element, a leak current flowing to another organic EL element 206 adjacent thereto as a unit element is decreased. The second electron transfer layer 106b and the electron injection layer 110 are smaller than the light emitting layer 112 as seen in a plan view, and are covered with the light emitting layer 112. With such a structure, the hole transfer layer 114 is prevented from contacting the second electron transfer layer 106b or the electron injection layer 110.

In this embodiment, the second electron transfer layer 106b and the electron injection layer 110 may be formed of an oxide semiconductor material, so as to be patterned by photolithography and etching. Thus, the leak current is prevented from flowing to an adjacent organic EL element 206. The organic EL element 206 is substantially the same as the organic EL element 200 in embodiment 1 except for the structure of the second electron transfer layer 106b and the electron injection layer 110, and provides substantially the same function and effect as those of the organic EL element 200. The structure of the second electron transfer layer 106b and the electron injection layer 110 in this embodiment is applicable to the organic EL element 202 in embodiment 2.

Fifth Embodiment

In this embodiment, an organic EL element in which the third insulating layer 122 has a different structure as that of the organic EL element 200 in embodiment 1 will be described. Hereinafter, portions different from those in embodiment 1 will be described, and portion common to those in embodiment 1 will not be described.

Figure 15:
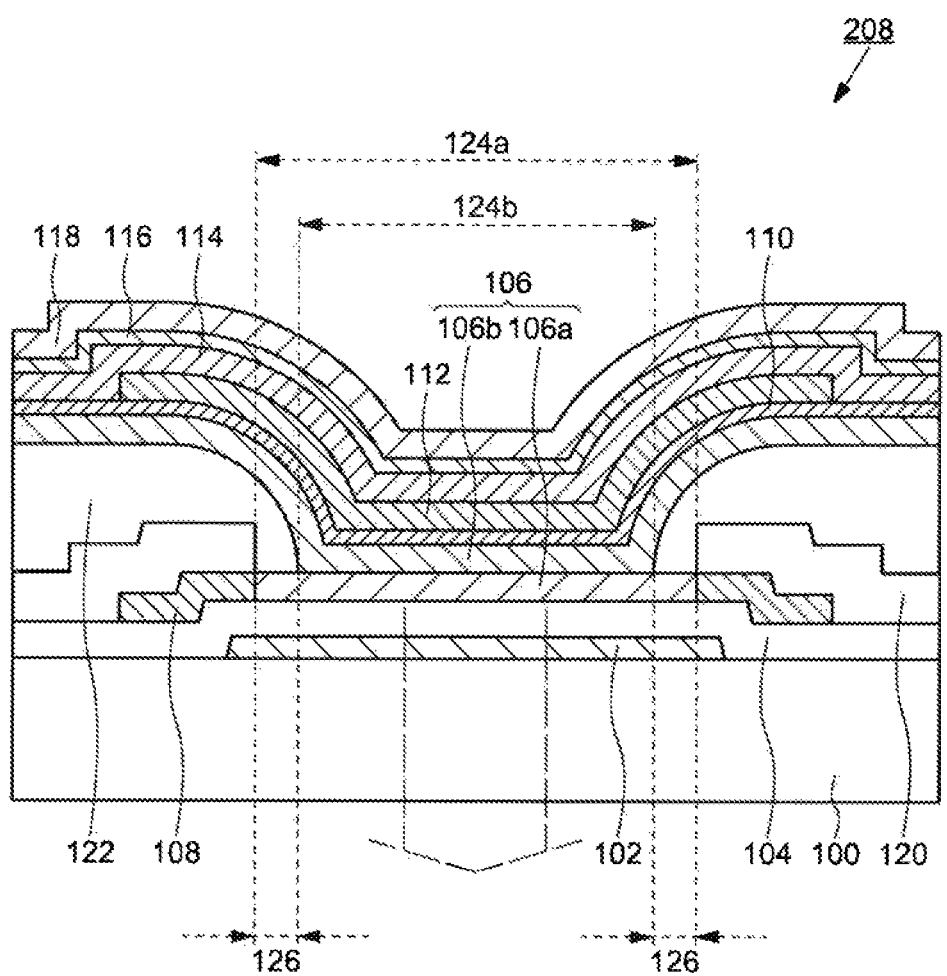
FIG. 15 is a cross-sectional view showing a structure of an organic EL element in an embodiment according to the present invention.

FIG. 15 shows a cross-sectional structure of an organic EL element 208 in this embodiment. Unlike in the organic EL element 200 in embodiment 1, in the organic EL element 208, an end of the opening 124b of the third insulating layer 122 is located inner to the end of the opening 124a of the second insulating layer 120. In this embodiment, it is preferred that the third insulating layer 122 is formed of a photosensitive organic resin material such as polyimide resin, acrylic resin, epoxy resin or the like.

In the case where the third insulating layer 122 is formed of an organic resin material, the inner surface of the opening 124b is allowed to be inclined and curved. In other words, in the case where the third insulating layer 122 is formed of an organic resin material, the end of the opening 124b is allowed to be curved as seen in a cross-sectional view. With the structure in which the end of the opening 124b is curved, the second electron transfer layer 106b, the electron injection layer 110, the light emitting layer 112, the hole transfer layer 114 and the hole injection layer 116 are formed on a top surface the first electron transfer layer 106a and continuously on a surface of the third insulating layer 122. Namely, the organic EL element 208 is prevented from being cracked or having any other defect due to the stepped portion caused by the opening 124b.

The end of the opening 124a of the second insulating layer 120 is buried in the third insulating layer 122. This makes it unnecessary to taper the end of the opening 124a of the second insulating layer 120. Even if the end of the opening 124a of the second insulating layer 120 is vertical with respect to the first electron transfer layer 106a and the like, no influence is exerted on the step coverage of the layers including the second electron transfer layer 106b, the electron injection layer 110, the light emitting layer 112 and the like.

As described above, in this embodiment, since the opening 124b of the third insulating layer 122 has a curved inner surface and covers the end of the opening 124a of the second insulating layer 120, the second electron transfer layer 106b, the electron injection layer 110, the light emitting layer 112 and the like are prevented from being broken at the stepped portion. In addition, since the inner surface of the opening 124a of the second insulating layer 120 does not need to be tapered, the productivity of the organic EL element 208 is increased.

Figure 16:
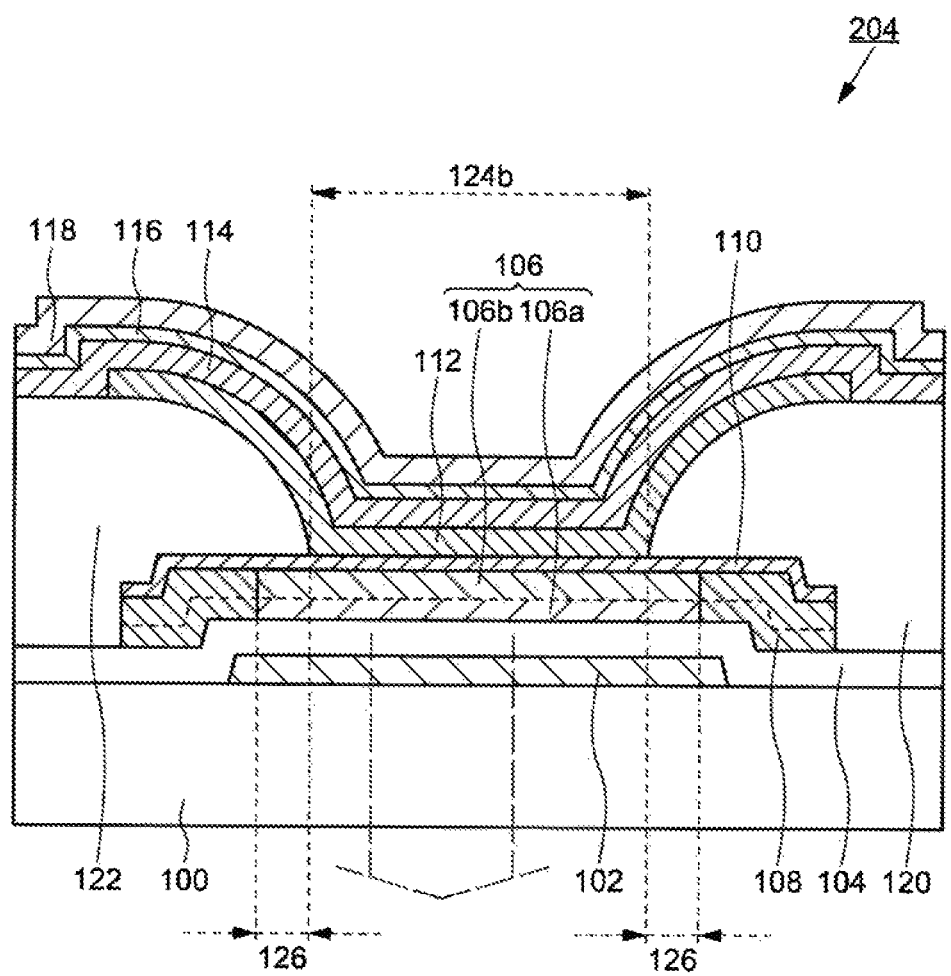
FIG. 16 is a cross-sectional view showing a structure of an organic EL element in an embodiment according to the present invention.

As shown in FIG. 16, like in embodiment 3, the first electron transfer layer 106a and the second electron transfer layer 106b may be stacked with no with no insulating layer being provided between the electron transfer layers 106a and 106b, the electron injection layer 110 may be stacked thereon and patterned, and then the third insulating layer 122 may be formed thereon of a photosensitive resin material. In the case where the first electron transfer layer 106a, the second electron transfer layer 106b and the electron injection layer 110 are formed of an inorganic material, the third insulating layer 122 may be formed of a photosensitive resin material and the opening 124b may be formed. This simplifies the structure and the production process of the organic EL element 204 shown in FIG. 16.

The organic EL element 208 is substantially the same as the organic EL element 200 in embodiment 1 except for the structure of the second insulating layer 120 and the third insulating layer 122, and provides substantially the same function and effect as those of the organic EL element 200. The structure of the organic EL element 204 in this embodiment may be appropriately combined with the structures in the other embodiments.

Sixth Embodiment

In this embodiment, an organic EL element having a forward-stacking structure including a first electrode controlling the amount of carriers to be injected will be described. In the organic EL element in this embodiment, the layers and the electrodes are stacked in a different order from that of the organic EL element 200 in embodiment 1, but are formed of the same materials as those of the organic EL element 200 in embodiment 1.

Figure 17:
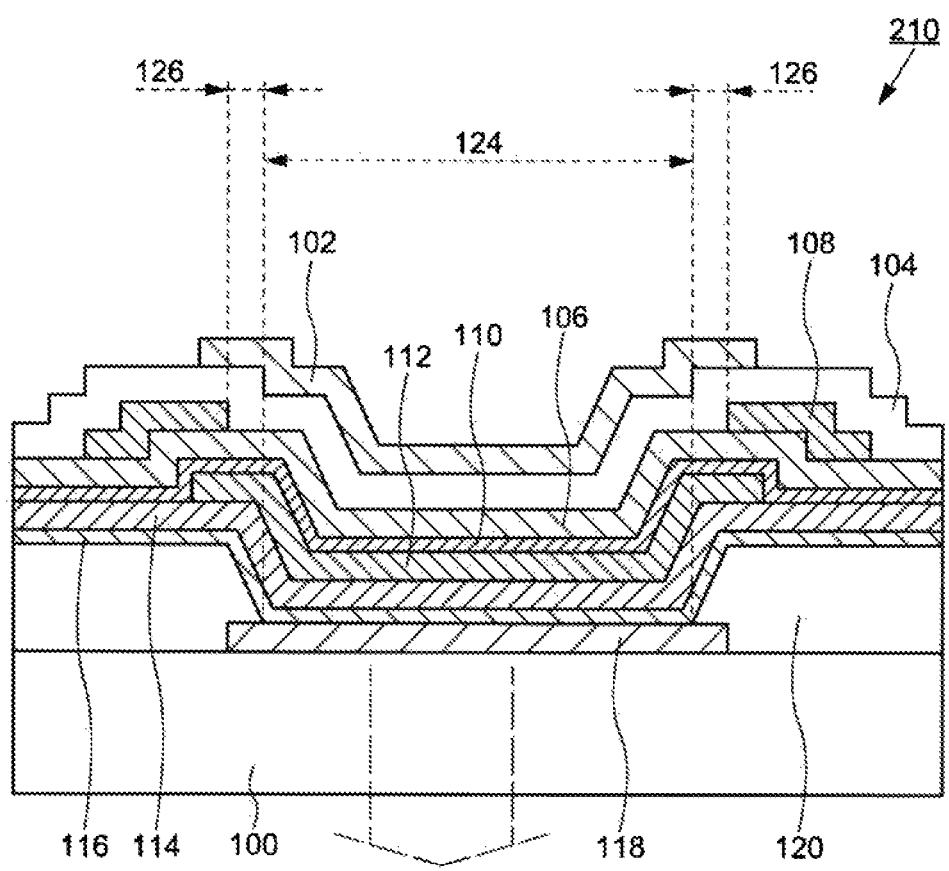
FIG. 17 is a cross-sectional view showing a structure of an organic EL element in an embodiment according to the present invention.

As shown in FIG. 17, an organic EL element 210 includes the substrate 100, and also includes the third electrode 118, the hole injection layer 116, the hole transfer layer 114, the light emitting layer 112, the electron injection layer 110, the electron transfer layer 106, the first insulating layer 104 and the first electrode 102 stacked on the substrate 100, in this order from the side of the substrate 100. A peripheral region of the third electrode 118 is covered with the second insulating layer 120, and the third electrode 118 is in contact with the hole injection layer 116 in the opening 124a.

A region where the third electrode 118, the hole injection layer 116, the hole transfer layer 114, the light emitting layer 112, the electron injection layer 110 and the electron transfer layer 106 overlap each other in the opening 124 of the second insulating layer 120 is a light emitting region of the organic EL element 210. The first electrode 102 overlaps the electron transfer layer 106 with the first insulating layer 104 being provided between the first electrode 102 and the electron transfer layer 106. With such a structure, the first electrode 102 is capable of controlling the amount of carriers (electrons) to be injected into the light emitting layer 112. The second electrode 108 is provided on a region of the electron transfer layer 106 that does not overlap the opening 124.

The organic EL element 210 shown in FIG. 17 is of the bottom-emission type, in which the third electrode 118 is formed of a transparent conductive film and the first electrode 102 is formed of a metal film. Although not shown, the organic EL element 210 may be of the top-emission type, in which the third electrode 118 has a light-reflective surface and the first electrode 102 is formed of a transparent conductive film.

Even in the case where the organic EL element 210 is of the top-emission type, the first insulating layer 104 is provided between the second electrode 108 and the first electrode 102, and at least the second insulating layer 120 is provided between the second electrode 108 and the third electrode 118. The end of the second electrode 108 is located outer to the end of the opening 124 of the second insulating layer 120 to provide the offset region 126.

As described in this embodiment, in the case where the carrier injection amount control electrode (first electrode) 102 is provided on the electron transfer layer 106 with the first insulating film 104 being provided between the carrier injection amount control electrode (first electrode) 102 and the electron transfer layer 106, even the organic EL element 210 having the forward stacking structure is capable of controlling the amount of the carriers to be injected into the light emitting layer 112 by a bias voltage. Thus, the organic EL element 210 provides substantially the same function and effect as those of the organic EL element 200 in embodiment 1.

Seventh Embodiment

In this embodiment, an example of display device (organic EL display device) including pixels each including an organic EL element in an embodiment according to the present invention will be described.

Figure 18:
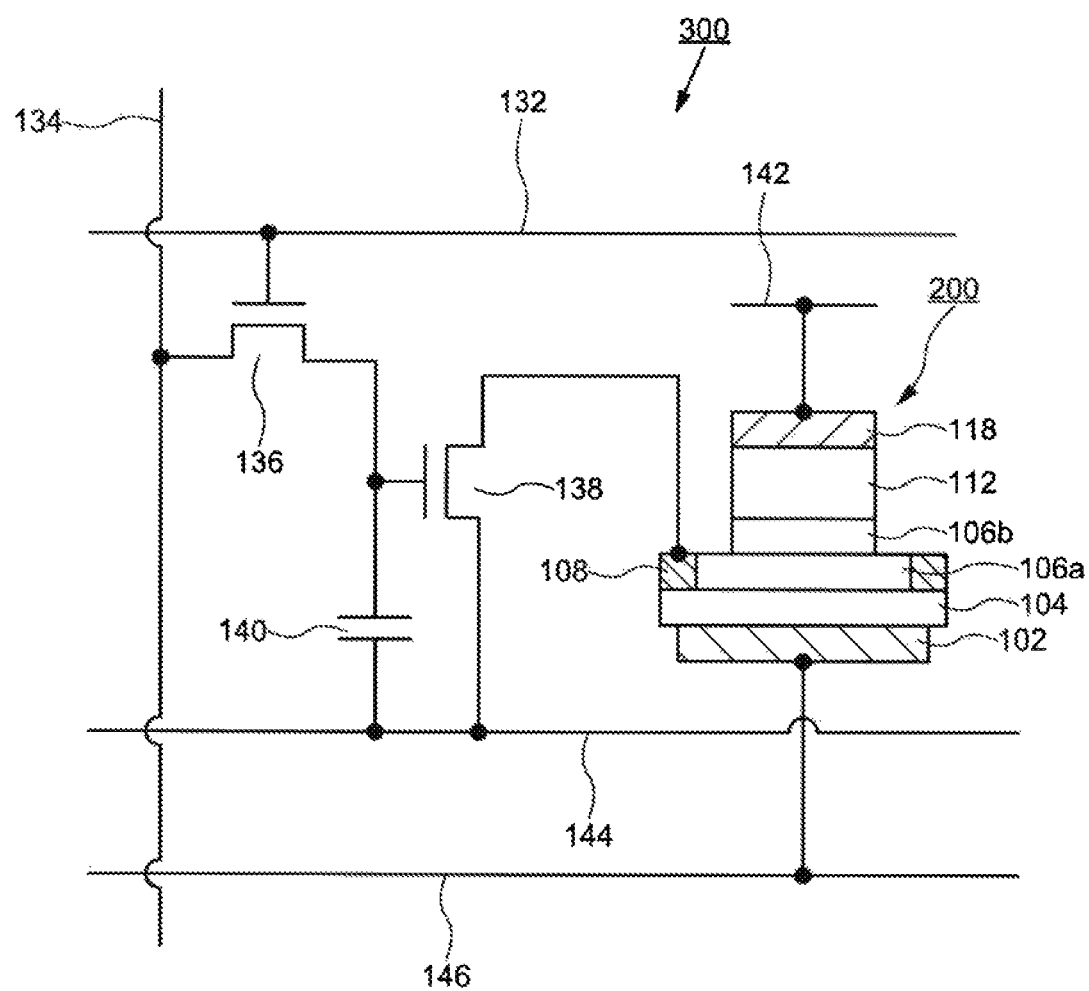
FIG. 18 shows an example of equivalent circuit of a pixel in a display device including an organic EL element in an embodiment according to the present invention.

FIG. 18 shows an equivalent circuit of a pixel 300 in a display device in an embodiment according to the present invention. The pixel 300 includes the organic EL element 200, a selection transistor 136, a driving transistor 138 and a capacitor 140. The selection transistor 136 includes a gate electrically connected with a scanning signal line 132, a source electrically connected with a data signal line 134, and a drain electrically connected with a gate of the driving transistor 138. The driving transistor 138 includes a source electrically connected with a common potential line 144, and a drain electrically connected with the second electrode 108 of the organic EL element 200. The capacitor 140 is electrically connected between the gate of the driving transistor 138 and the common potential line 144. Regarding the organic EL element 200, the first electrode 102 is electrically connected with a carrier injection amount control signal line 146, and the third electrode 118 is electrically connected with a power supply line 142.

In FIG. 18, the organic EL element 200 is not merely shown with the circuit symbol, but is schematically shown such that the electrodes thereof are at the actual positions in the organic EL element 200, in order to specifically show the connection structure of the organic EL element 200. Although FIG. 18 shows the organic EL element 200 in embodiment 1, embodiment 7 is not limited to this, and any of the organic EL elements in embodiments 2 to 6 is also applicable.

In the equivalent circuit shown in FIG. 18, the scanning signal line 132 is supplied with a scanning signal, and the data signal line 134 is supplied with a data signal (video signal). The power supply line 142 is supplied with a power supply potential (Vdd), and the common potential line 144 is supplied with the ground potential (earth potential) or a potential (Vss) lower than the power supply potential (Vdd). The carrier injection amount control signal line 146 is supplied with a voltage (Vg) controlling the amount of the carriers to be injected into the light emitting layer 112 as described above with reference to FIG. 6. The voltage (Vg) controlling the amount of the carriers to be injected may be a constant positive voltage or a voltage changing between predetermined voltages Vg1 and Vg2 as shown in FIG. 6.

The pixel 300 shown in FIG. 18 is operated as follows. When the selection transistor 136 is turned on, the gate of the driving transistor 138 is supplied, by the data signal line 134, with a voltage based on the data signal. The capacitor 140 maintains the voltage between the source and the gate of the driving transistor 138. When the gate of the driving transistor 138 is turned on, an electric current flows from the power supply line 142 into the organic EL element 200, and the organic EL element 200 emits light. At this point, the voltage (Vg) controlling the amount of the carriers to be injected may be applied to the first electrode 102, so that the light emission intensity of the organic EL element 200 is controlled, and also the position of the region where the electrons and the holes are recombined (in other words, the light emitting region) in the light emitting layer 122 is controlled. Namely, the carrier balance in the light emitting layer 112 is controlled.

In this embodiment, the pixel 300 includes the organic EL element 200 including the carrier injection amount control electrode (first electrode 102), and the carrier injection amount control signal line 146 is provided and is connected with the carrier injection amount control electrode (first electrode 102). With such a structure, the light emission state of the organic EL element 200 is controlled. Namely, the light emission of the organic EL element 200 is not controlled only by the driving transistor 138 but is controlled also by the carrier injection amount control electrode (first electrode 102). Thus, the organic EL element 200 is prevented from being deteriorated, and thus the reliability of the organic EL element 200 is improved.

Eighth Embodiment

In this embodiment, an example of display device (organic EL display device) including pixels each including an organic EL element in an embodiment according to the present invention will be described.

Figure 19:
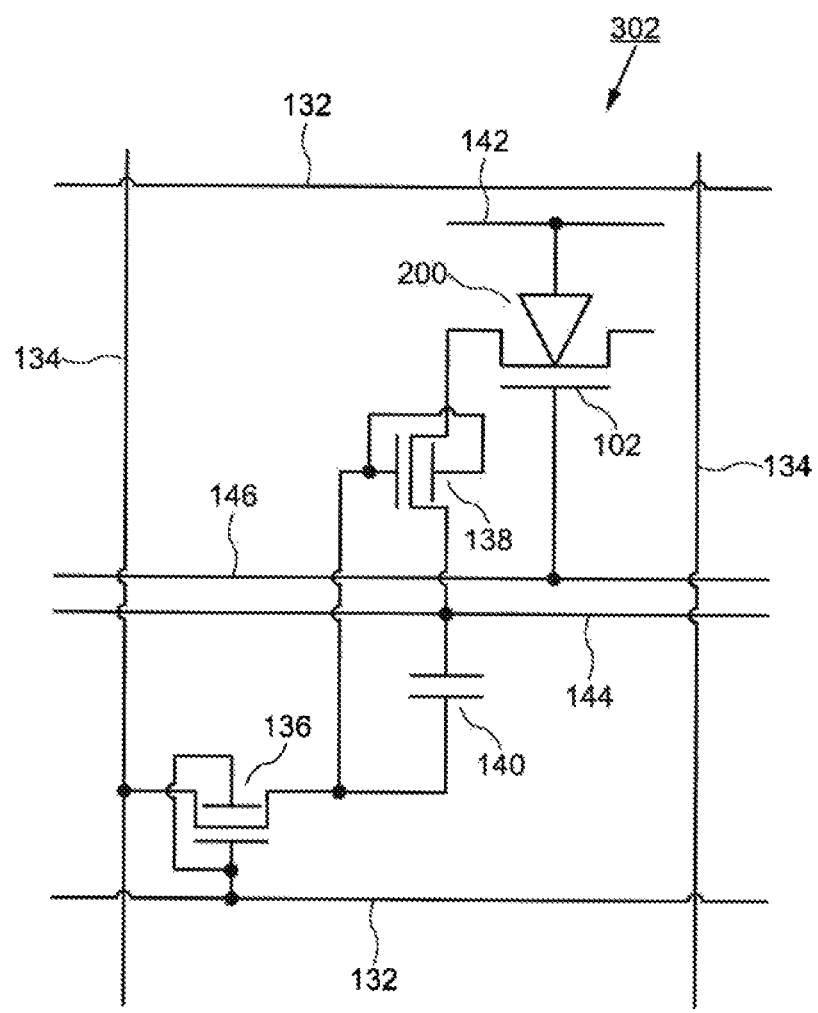
FIG. 19 shows an example of equivalent circuit of a pixel in a display device including an organic EL element in an embodiment according to the present invention.

FIG. 19 shows an example of equivalent circuit of a pixel 302 provided in a display device in this embodiment. Like in embodiment 7, the pixel 302 includes the organic EL element 200, the selection transistor 136, the driving transistor 138 and the capacitor 140. The gate of the selection transistor 136 is electrically connected with the scanning signal line 132, the source of the selection transistor 136 is electrically connected with the data signal line 134, and the drain of the selection transistor 136 is electrically connected with the gate of the driving transistor 138. The source of the driving transistor 138 is electrically connected with the common potential line 144, and the drain of the driving transistor 138 is electrically connected with the second electrode 108 of the organic EL element 200. The capacitor 140 is electrically connected between the gate of the driving transistor 138 and the common potential line 144. Regarding the organic EL element 200, the first electrode 102 is electrically connected with the carrier injection amount control signal line 146, and the third electrode 118 is electrically connected with the power supply line 142. FIG. 19 shows a case where the selection transistor 136 and the driving transistor 138 are each of a dual-gate type.

Figure 20:
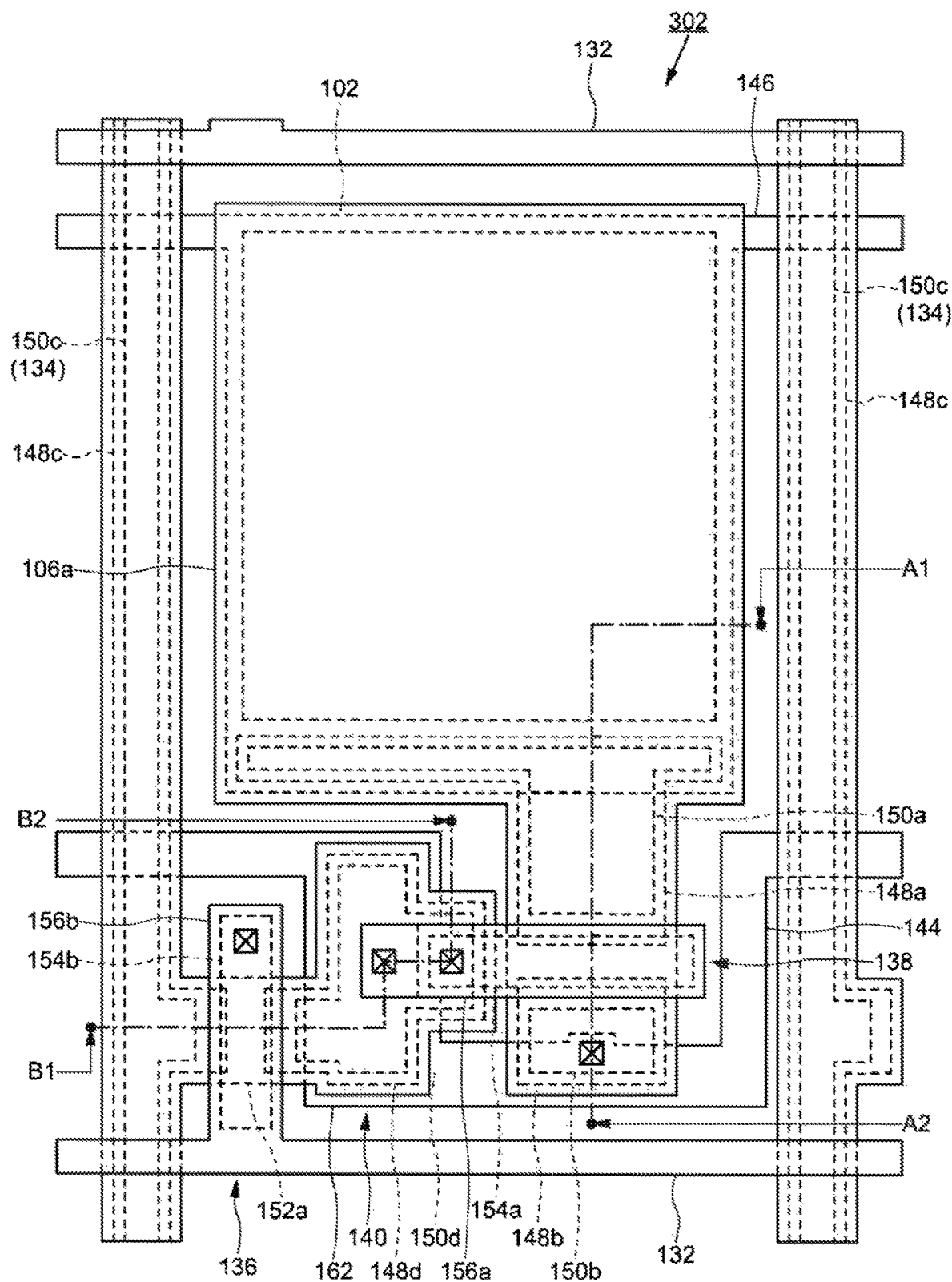
FIG. 20 is a plan view showing a structure of the pixel in the display device including the organic EL element In an embodiment according to the present invention.
Figure 21A:
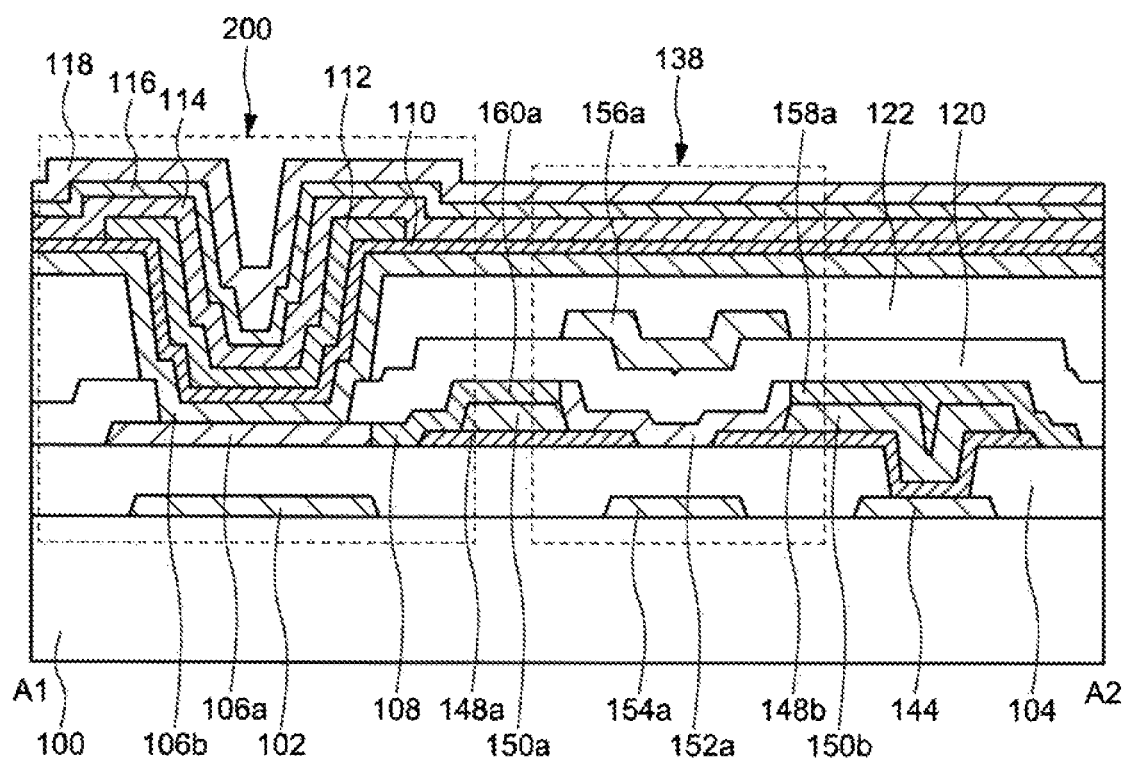
FIG. 21A and FIG. 21B are each a cross-sectional view showing a structure of the pixel in the display device including the organic EL element in an embodiment according to the present invention.
Figure 21B:
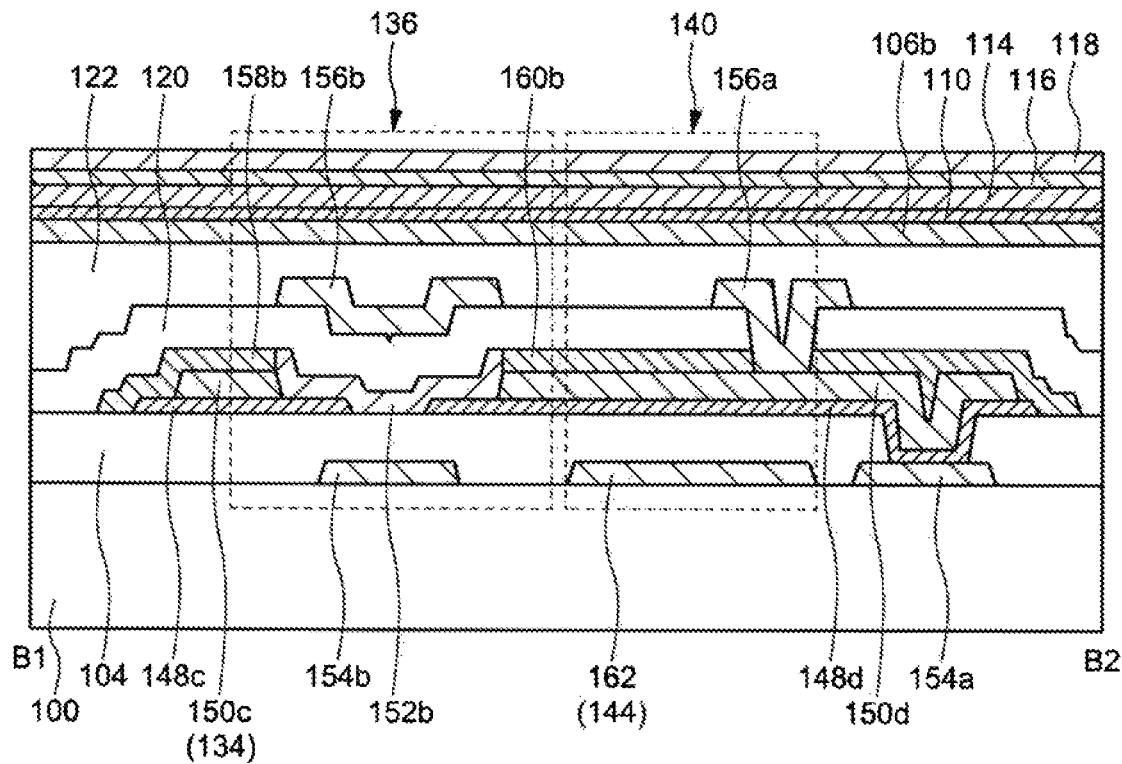

FIG. 20 is a plan view of the pixel 302 in the display device in this embodiment. FIG. 21A shows a cross-sectional structure taken along line A1-A2 in FIG. 20, and FIG. 21B shows a cross-sectional structure taken along line B1-B2 in FIG. 20. In the following description, these figures will be referred to.

The pixel 302 includes the selection transistor 136, the driving transistor 138, the capacitor 140 and the organic EL element 200. In the plan view of the pixel 302 shown in FIG. 20, the first electrode 120, the first electron transfer layer 106a and the opening 124 are shown as components of the organic EL element 200.

The driving transistor 136 includes a first oxide semiconductor layer 152a, a first gate electrode 154a and a second gate electrode 156a. The first gate electrode 154a and the second gate electrode 156a respectively include regions overlapping each other with the first oxide semiconductor layer 152a being provided between the first gate electrode 154a and the second gate electrode 156a. The first insulating layer 104 is located between the first oxide semiconductor layer 152a and the substrate 100. The first gate electrode 154a is located between the first insulating layer 104 and the substrate 100. The second insulating layer 120 is located between the first oxide semiconductor layer 152a and the second gate electrode 156a. In other words, the first oxide semiconductor layer 152a is held between the first insulating layer 104 and the second insulating layer 120, and the first insulating layer 104, the first oxide semiconductor layer 152a and the second insulating layer 120 are located between the first gate electrode 154a and the second gate electrode 156a.

In this embodiment, the driving transistor 138 has a dual-gate structure in which the first oxide semiconductor layer 152a is held between the first gate electrode 154a and the second gate electrode 156a. The driving transistor 138 includes a channel region where the first oxide semiconductor layer 152a overlaps one of, or both of, the first gate electrode 154a and the second gate electrode 156a. The first oxide semiconductor layer 152a may include a low resistance region, having a specific resistance lower than that of the channel region, outer to the region overlapping the first gate electrode 154a and/or the second gate electrode 156a. FIG. 21A shows the low resistance region as a source region 158a and a drain region 160a.

It is preferred that the channel region of the first oxide semiconductor layer 152a has a carrier concentration of $1 \times 10^{14}$/cm$^3$ to $5 \times 10^{16}$/cm$^3$, and that the source region 158a and the drain region 160a each have a carrier concentration of $1 \times 10^{19}$/cm$^3$ to $5 \times 10^{21}$/cm$^3$. The carrier concentration of the source region 158a and the drain region 160a may be increased by, for example, increasing the density of the donor level caused by oxygen deficiency in the first oxide semiconductor layer 152a. The oxygen deficiency in the first oxide semiconductor layer 152a may be caused by plasma processing by use of noble gas such as helium (He), argon (Ar) or the like, hydrogen plasma processing, or laser light irradiation.

In the driving transistor 138, a first transparent conductive layer 148a and a second transparent conductive layer 148b are located between the first oxide semiconductor layer 152a and the first insulating layer 104. The first transparent conductive layer 148a and the second transparent conductive layer 148b are located away from each other. A conductive layer 150a is located between the first transparent conductive layer 148a and the first oxide semiconductor layer 152a, and a conductive layer 150b is located between the second transparent conductive layer 148b and the first oxide semiconductor layer 152a. The conductive layer 150a is located inner to an end of the first transparent conductive layer 148a, and the conductive layer 150b is located inner to an end of the second transparent conductive layer 148b. The first transparent conductive layer 148a and the conductive layer 150a are located to contact the drain region 160a, and the second transparent conductive layer 148b and the conductive layer 150b are located to contact the source region 158a.

The first gate electrode 154a and the second gate electrode 156a are located to overlap each other in a region corresponding to a gap between the first transparent conductive layer 148a and the second transparent conductive layer 148b. The first transparent conductive layer 148a and the second transparent conductive layer 148b may be located to partially overlap one of, or both of, the first gate electrode 154a and the second gate electrode 156a. In the case where at least one of the first transparent conductive layer 148a and the second transparent conductive layer 148b overlaps one of, or both of, the first gate electrode 154a and the second gate electrode 156a and is adjacent to the channel region of the first oxide semiconductor layer 152a, the drain current of the driving transistor 138 is increased.

The source region 158a of the driving transistor 138 is electrically connected with the common potential line 144 via a contact hole formed in the first insulating layer 104. The drain region 160a of the first oxide semiconductor layer 152a extends to a region where the organic EL element 200 is located. Namely, the first oxide semiconductor layer 152a is located to overlap the first electrode 102 with the first insulating layer 104 being provided between the first oxide semiconductor layer 152a and the first electrode 102. The region where the first oxide semiconductor layer 152a overlaps the first electrode 102 has a carrier concentration adjusted to the range of $1 \times 10^{14}$/cm$^3$ to $5 \times 10^{19}$/cm$^3$ and thus acts as the first electron transfer layer 106a. The first oxide semiconductor layer 152a includes a region acting as the second electrode 108 adjacent to the region acting as the first electron transfer layer 106a. The region of the first oxide semiconductor layer 152a acting as the second electrode 108 is continuous from the drain region 160a. As described in this embodiment, the carrier concentration of the first oxide semiconductor layer 152a may be controlled region by region, so that a structure in which the driving transistor 138 and the organic EL element 200 are connected with each other via the first oxide semiconductor layer 152a is provided. Thus, the structure of the pixel 302 is simplified.

As shown in FIG. 21B, the selection transistor 136 has substantially the same structure as that of the driving transistor 138. More specifically, the selection transistor 136 includes a second oxide semiconductor layer 152b, a first gate electrode 154b and a second gate electrode 156b. The selection transistor 136 further includes a third transparent conductive layer 148c, a conductive layer 150c, a fourth transparent conductive layer 148d and a conductive layer 150d, which are in contact with the second oxide semiconductor layer 152b. The second oxide semiconductor layer 152b may include a source region 158b and a drain region 160b each as a low resistance region. The conductive layer 150c forms the data signal line 134.

The drain region 160b of the selection transistor 136 is electrically connected with the first gate electrode 154a of the driving transistor 138 via a contact hole formed in the first insulating layer 104. For example, the fourth transparent conductive layer 148d and the conductive layer 150d may be provided between the drain region 160b and the first gate electrode 154a. The drain region 160b of the selection transistor 136 is electrically connected with the second gate electrode 156a of the driving transistor 138 via a contact hole formed in the second insulating layer 120. In this manner, the drain region 160b provided as a part of the second oxide semiconductor layer 152b is stacked on the fourth transparent conductive layer 148d and the conductive layer 150d, and thus easily forms electric connection with each of the first gate electrode 154a and the second gate electrode 156a of the driving transistor 138.

The capacitor 140 is formed in a region where the fourth transparent conductive layer 148d overlaps a capacitor electrode 162 with the first insulating layer 104 being provided between the fourth transparent conductive layer 148d and the capacitor electrode 162. The capacitor electrode 162 also acts as the common potential line 144.

In this embodiment, the oxide semiconductor layer 152 may be formed of the same material as described in embodiment 1. The first insulating layer 104 and the second insulating layer 120 are formed of an inorganic insulating material. Examples of the inorganic insulating material include silicon oxide, silicon nitride, silicon oxide nitride, aluminum oxide, and the like.

The transparent conductive layer 148 may be formed of a metal oxide material such as titanium oxide (TiO$_x$) or the like, a metal nitride material such as titanium nitride (TiN$_x$), zirconium nitride (ZrN$_x$) or the like, or a metal oxide nitride material such as titanium oxide (TiO$_x$N$_y$), tantalum oxide nitride (TaO$_x$N$_y$), zirconium oxide nitride (ZrO$_x$N$_y$), hafnium oxide nitride (HfO$_x$N$_y$) or the like. A trace amount of metal element improving the conductivity may be added to such a metal oxide material, such a metal nitride material and such a metal oxide nitride material. For example, niobium (Nb)-doped titanium oxide (TiO$_2$:Nb) may be used.

The conductive layer 150 may be formed of a metal material having a high conductivity such as aluminum (Al), copper (Cu) or the like. For example, the conductive layer 150c (data signal line 134) is formed of an aluminum alloy, a copper alloy or a silver alloy. It is preferred that the common potential line 144, and the first gate electrode 154 formed in the same layer as the common potential line 144, are also formed of an aluminum alloy, a copper alloy or a silver alloy. The second electrode 156 and the scanning signal line 132 are formed of a metal material such as aluminum (Al), molybdenum (Mo), tungsten (W), zirconium (Zr) or the like. Examples of the aluminum alloy include an aluminum-neodymium alloy (Al—Nd), an aluminum-titanium alloy (Al—Ti), an aluminum-silicon alloy (Al—Si), an aluminum-neodymium-nickel alloy (Al—Nd—Ni), an aluminum-carbon-nickel alloy (Al—C—Ni), a copper-nickel alloy (Cu—Ni), and the like. The conductive layer 150 formed of such a metal material is heat-resistant and also decreases the line resistance.

The organic EL element 200 has substantially the same structure as that in embodiment 1. The organic EL element 200 is electrically connected with the driving transistor 138. In the organic EL element 200, a region corresponding to the second electrode 108 is formed continuously from the first oxide semiconductor layer 152a of the driving transistor 138. With such a structure, the wiring structure of the lines is simplified, and the pixel 302 has an increased numerical aperture (ratio of the region actually emitting light in the organic EL element 200 with respect to the area size of one pixel). The organic EL element 200 may be replaced with any of the organic EL elements in embodiments 2 to 6.

In order to increase the numerical aperture of the pixel, the electron mobility of the first electron transfer layer 106a needs to be increased. For example, in a display panel having a resolution of 8K×4K (7680×4320 pixels) and a size of 85 inches, the pixel pitch is about 244 µm. Assuming that the pixel is rectangular, the longer side of the pixel has a length of about 732 µm. Assuming that the time required for the organic EL element to actually emit light after being supplied with a voltage is about 4 to 5 µsec, in the case where a region corresponding to the second electrode 108 is provided at an end of the rectangular pixel in the longitudinal direction, the carrier (electron) mobility of the first electron transfer layer 106a needs to be 10 $cm^2/V \cdot sec$. or greater, preferably 20 $cm^2/V \cdot sec$. or greater. Otherwise, it is difficult for the carriers (electrons) to reach the other end of the pixel in the longitudinal direction.

Needless to say, in the case where a region corresponding to the second electrode 108 is provided to enclose the four sides of the rectangular pixel, the carriers are drifted from the four side toward the center of the pixel. Thus, the carrier (electron) mobility merely needs to be about 2.5 $cm^2/V \cdot sec$. or greater. However, in this case, there is a problem that the area size of the effective light emitting region per pixel is decreased and thus the numerical aperture is decreased.

In such a situation, use of the oxide semiconductor material described in this embodiment realizes a required carrier (electron) mobility. An electron transfer layer formed of an organic material as described in each of Japanese Laid-Open Patent Publication No. 2007-149922 and Japanese Laid-Open Patent Publication No. 2007-157871 has a problem that the carrier (electron) mobility is lower than 2.5 $cm^2/V \cdot sec$. and thus does not realize a larger screen or a higher definition for the display panel.

The display device in this embodiment uses the oxide semiconductor layer as the electron transfer layer 106 included in the organic EL element 200. With such a structure, the electron transfer layer 106 is formed in the same step as the components such as the driving transistor 138, the selection transistor 136 and the like formed of an oxide semiconductor material. The organic EL element included in the display device in this embodiment includes the carrier injection amount control electrode (the first electrode 102) and also includes the electron transfer layer 106, having a high carrier (electron) mobility, located to face the carrier injection amount control electrode (the first electrode 102) with the insulating layer (the first insulating layer 104) being provided between the electron transfer layer 106 and the carrier injection amount control electrode 102. With such a structure, the light emission intensity in the plane of the pixel is uniformized, which contributes to a higher definition.

What is claimed is:

1. A reverse-stacked organic electroluminescence device, comprising:
    a first electrode;
    a third electrode including a region overlapping the first electrode;
    a first insulating layer between the first electrode and the third electrode;
    a second insulating layer between the first insulating layer and the third electrode;
    an electron transfer layer between the first insulating layer and the third electrode;
    an electron injection layer between the electron transfer layer and the third electrode;
    a light emitting layer, containing an organic electroluminescence material, between the electron injection layer and the third electrode;
    a second electrode located between the first insulating layer and the second insulating layer and electrically connected with the electron transfer layer, and
    a third insulating layer between the second insulating layer and the third electrode,
    wherein
    the second insulating layer includes a first opening,
    the third insulating layer includes a second opening overlapping with the first opening,
    the organic electroluminescence device includes an overlap region where the third electrode, the light emitting layer, the electron injection layer, the electron transfer layer, the first insulating layer and the first electrode overlap each other in the first opening and the second opening,
    the first electrode is continuous, and the second electrode overlaps end portions of the first electrode and extends outward beyond the end portions of the first electrode, and
    the electron transfer layer comprises a first electron transfer layer and a second electron transfer layer, the first electron transfer layer is arranged on the overlap region and between the first insulating layer and the second insulating layer, and is in contact with the second electrode, the second electron transfer layer is arranged on the overlap region and is in contact with the second insulating layer and the third insulating layer.

2. The reverse-stacked organic electroluminescence device according to claim 1,
    wherein
    the first electron transfer layer includes a region in contact with the first insulating layer and the second insulating layer, and a second electron transfer layer includes a region arranged between the third insulating layer and the electron injection layer, and
    the second electrode is arranged between the first electron transfer layer and the first insulating layer.

3. The reverse-stacked organic electroluminescence device according to claim 1,
wherein the third electrode is light-reflective and the first electrode is light-transmissive.

4. The reverse-stacked organic electroluminescence device according to claim 1,
wherein the electron transfer layer includes an offset region between an end of the second electrode and an end of the opening.

5. The reverse-stacked organic electroluminescence device according to claim 4,
wherein the offset region has a length of 1 μm to 5 μm.

6. The reverse-stacked organic electroluminescence device according to claim 4,
wherein the offset region overlaps the first electrode.

7. The reverse-stacked organic electroluminescence device according to claim 2,
wherein the second electrode is arranged between the first insulating layer and the first electron transfer layer.

8. The reverse-stacked organic electroluminescence device according to claim 7,
wherein a first surface of the second electrode is in contact with the first insulating layer and a second surface of the second electrode is in contact with the first electron transfer layer.

9. The reverse-stacked organic electroluminescence device according to claim 2,
whereon the second electron transfer layer overlaps the second electrode and extends outward beyond the second electrode.

10. The reverse-stacked organic electroluminescence device according to claim 9,
wherein the electron injection layer overlaps with the second electrode and extends outward beyond the second electrode.

11. The reverse-stacked organic electroluminescence device according to claim 1,
wherein the second electrode partially overlaps the first electrode.

12. The organic electroluminescence element according to claim 1,
wherein a width of the second opening is larger than a width of the first opening.

13. An organic electroluminescence element, comprising:
a first electrode on an insulating substrate;
a third electrode including a region overlapping the first electrode;
a first insulating layer between the first electrode and the third electrode;
an electron transfer layer between the first insulating layer and the third electrode;
a second electrode, electrically connected with the electron transfer layer; a second insulating layer located between the second electrode and the third electrode, entirely covering the second electrode, and including a first opening;
a third insulating layer located between the second insulating layer and the third electrode, overlapping the second electrode, and including a second opening overlapping with the first opening, and
a light emitting layer comprising an organic electroluminescence material and located between the electron transfer layer and the third electrode;
wherein the organic electroluminescence device includes an overlap region where the third electrode, the light emitting layer, the electron transfer layer, the first insulating layer and the first electrode overlap each other in the first opening and the second opening,
the second electrode is located between the first insulating layer and the second insulating layer and includes an overlapping portion which overlaps with the first electrode and a non-overlapping portion which does not overlap with the first electrode, and
the electron transfer layer comprises a first electron transfer layer and a second electron transfer layer, the first electron transfer layer is arranged on the overlap region and between the first insulating layer and the second insulating layer, and is in contact with the second electrode, the second electron transfer layer is arranged on the overlap region and is in contact with the second insulating layer and the third insulating layer.

14. The organic electroluminescence element according to claim 13,
wherein the first electrode includes a first portion overlapping with the first opening of the second insulating layer and the second opening of the third insulating layer, and a remaining portion other than the first portion, and the first portion and the remaining portion are electrically connected.

15. The organic electroluminescence element according to claim 13,
wherein a first surface of the second electrode is in contact with the first insulating layer and a second surface of the second electrode is in contact with the first electron transfer layer.

16. The organic electroluminescence element according to claim 15, further comprising:
an electron injection layer between the second electron transfer layer and the light emitting layer,
wherein the second electron transfer layer includes a region arranged between the third insulating layer and the electron injection layer.

17. The organic electroluminescence element according to claim 13,
wherein a width of the second opening is larger than a width of the first opening.

18. A reverse-stacked organic electroluminescence device, comprising:
a first electrode connected to a carrier injection amount control signal line;
a third electrode connected to a power supply line and including a region overlapping the first electrode;
a first insulating layer between the first electrode and the third electrode;
a second insulating layer between the first insulating layer and the third electrode;
an electron transfer layer between the first insulating layer and the third electrode;
an electron injection layer between the electron transfer layer and the third electrode;
a light emitting layer, containing an organic electroluminescence material, between the electron injection layer and the third electrode;
a second electrode connected to a drain of a driving transistor and located between the first insulating layer and the second insulating layer and electrically connected with the electron transfer layer; and
a third insulating layer between the second insulating layer and the third electrode, and overlapping with the second electrode, wherein
the second insulating layer includes a first opening, and the third insulating layer includes a second opening overlapping with the first opening,
the organic electroluminescence device includes an overlap region where the third electrode, the light emitting layer, the electron injection layer, the electron transfer layer, the first insulating layer and the first electrode overlap each other in the opening,
the first electrode is continuous, and the second electrode overlaps end portions of the first electrode and extends outward beyond the end portions of the first electrode, and
the electron transfer layer comprises a first electron transfer layer and a second electron transfer layer, the first electron transfer layer is arranged on the overlap region and between the first insulating layer and the second insulating layer, and is in contact with the second electrode, the second electron transfer layer is arranged on the overlap region and is in contact with the second insulating layer and the third insulating layer.

19. The organic electroluminescence element according to claim 18, wherein the first electrode is applied positive voltage form the carrier injection amount control signal line.

20. The organic electroluminescence element according to claim 18, wherein the second insulating layer extends between the drain and a gate electrode of the driving transistor, and the third insulating layer covers the gate.

* * * * *